(12) United States Patent
Russ et al.

(10) Patent No.: US 8,310,027 B2
(45) Date of Patent: Nov. 13, 2012

(54) ELECTRONIC DEVICE AND MANUFACTURING METHOD THEREOF

(75) Inventors: Christian Russ, Diedorf (DE); Christian Pacha, Munich (DE); Snezana Jenei, Munich (DE); Klaus Schruefer, Baldham (DE)

(73) Assignee: Infineon Technologies AG, Neubiberg (DE)

( * ) Notice: Subject to any disclaimer, the term of this patent is extended or adjusted under 35 U.S.C. 154(b) by 788 days.

(21) Appl. No.: 12/138,319

(22) Filed: Jun. 12, 2008

(65) Prior Publication Data

US 2009/0309167 A1    Dec. 17, 2009

(51) Int. Cl.
*H01L 29/73* (2006.01)
(52) U.S. Cl. ........ 257/575; 257/197; 257/576; 257/370; 257/378; 257/E27.015; 257/E29.174
(58) Field of Classification Search .......... 257/575–576, 257/197, 370, 378, E29.174, E27.015
See application file for complete search history.

(56) References Cited

U.S. PATENT DOCUMENTS

| | | | |
|---|---|---|---|
| 5,510,647 A | 4/1996 | Nakajima et al. | |
| 6,972,466 B1 | 12/2005 | Liang et al. | |
| 7,723,198 B2 | 5/2010 | Brandl | |
| 2006/0091463 A1 | 5/2006 | Donze et al. | |
| 2007/0298549 A1 | 12/2007 | Jurczak et al. | |
| 2008/0001234 A1 | 1/2008 | Cheng et al. | |
| 2008/0003757 A1* | 1/2008 | Cheng et al. | 438/309 |

FOREIGN PATENT DOCUMENTS

DE    10 2004 061 327 A1    6/2006

* cited by examiner

*Primary Examiner* — Minchul Yang
(74) *Attorney, Agent, or Firm* — Slater & Matsil, L.L.P

(57) ABSTRACT

Embodiments relate to a bipolar transistor that includes a body region having a fin structure. At least one terminal region may be formed over at least a portion of the body region. The at least one terminal region may be formed as an epitaxially grown region. Embodiments also relate to a vertically integrated electronic device that includes a first terminal region, a second terminal region and a third terminal region. The second terminal region may be arranged over at least a portion of the third terminal region, and at least two of the first, second and third terminal regions may be formed as epitaxially grown regions.

26 Claims, 25 Drawing Sheets

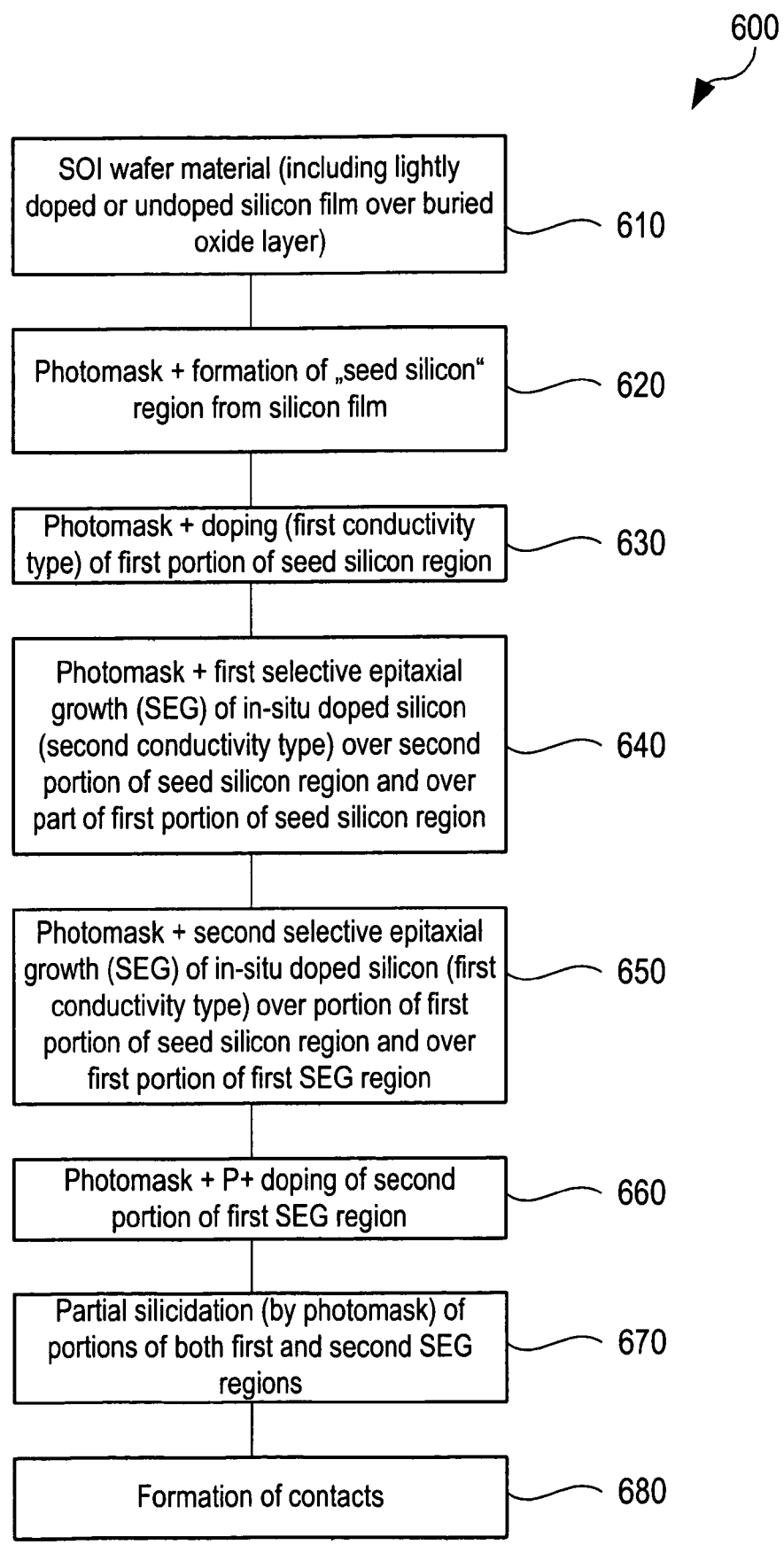

| Devices used for connection to „IN" terminal | Devices used for connection to „OUT" terminal | Devices used for optional ESD protection for „IN", „OUT", supply terminals |
|---|---|---|
| MOS | MOS | MOS and/or BJT |
| BJT | MOS | MOS and/or BJT |
| MOS | BJT | MOS and/or BJT |
| BJT | BJT | MOS and/or BJT |

ELECTRONIC DEVICE AND MANUFACTURING METHOD THEREOF

TECHNICAL FIELD

Embodiments relate generally to electronic devices and manufacturing methods for electronic devices.

BACKGROUND

Multigate field-effect transistor (MuGFET) or fin field-effect transistor (FinFET) devices are expected to be used in the future due to the limited down-scaling capability of conventional planar or bulk CMOS technologies (CMOS: complementary metal oxide semiconductor). A fin field-effect transistor (FinFET) may be understood to mean a field-effect transistor having at least one fin structure. A fin structure or fin may, for example, include a ridge structure or a bridge structure, which is formed or freely suspended on a substrate. A multi-gate field effect-transistor (MuGFET) may, for example, include a field-effect transistor, in which a channel region is driven by two or more gates, e.g. a MOS device that has multiple gates on one fin.

FinFET devices are typically designed for high-speed logic core applications featuring low supply voltages (e.g., 0.8 V to 1.2 V). A reduction of source/drain series resistance is one issue to be addressed in FinFET technology optimization. In this context, a possible process solution may be Selective Epitaxial Growth (SEG) of silicon.

In SEG, silicon may be grown on the surface of an existing silicon film (so-called "seed silicon"). The silicon therefore may grow outside of the channel/spacer region on top of the source/drain landing pads of a FinFET device, on top of the fins (where not covered by the gate), and may (partially or fully) close the spacings between the fins (typically in facets). No SEG silicon will be grown on isolating layers such as buried oxide or nitride.

SEG may be an expense factor in the processing and may account, for example, for up to 4% of the total wafer processing cost. One reason for this may be seen in the slow growth rate of an SEG layer. For example, a regular SEG layer thickness as applied for source/drain resistance reduction may typically be on the order of about 10 nm to 60 nm. A thinner SEG layer having, for example, a thickness of about 5 nm to 10 nm, may add only about 1% of processing cost.

BiCMOS technologies integrate both CMOS and bipolar components into one processing technology which may be applied for mixed signal applications, such as high power and or high frequency circuits, where intelligent, complex and fast logic may be needed at the same time.

For a large market penetration and for covering various applications, FinFET technologies may need to cover a variety of additional device classes that expand beyond pure logic MOS devices. Integrating, for example, analog radio-frequency (RF) and mixed signal circuits into a FinFET technology may also require bipolar transistors for high power applications and fast switching behavior.

One further aspect may be the need for devices that are robust against damage by electrostatic discharge (ESD). Particularly in light of the known ESD sensitivity of conventional silicon-on-insulator (SOI) technologies, it may be desirable to protect output drivers and any other parts including power supply lines in such advanced technologies against ESD damage. In this context, ESD protection devices may be used to safely shunt the energy of an ESD pulse without being damaged themselves. Bipolar transistor operation is used frequently in case of mixed-voltage/over-voltage tolerant circuit applications where local clamping devices are used.

BRIEF DESCRIPTION OF THE DRAWINGS

In the drawings, like reference characters generally refer to the same parts throughout the different views. The drawings are not necessarily to scale, emphasis instead generally being placed upon illustrating the principles of the invention. In the following description, various embodiments of the invention are described with reference to the following drawings, in which:

FIG. 6 shows a method for producing a vertical bipolar transistor in accordance with another embodiment;

FIG. 18 shows possible combinations of FinFET/MuGFET devices and bipolar devices that may be applied in the circuit arrangement of FIG. 17.

DETAILED DESCRIPTION OF ILLUSTRATIVE EMBODIMENTS

Figure 1A:
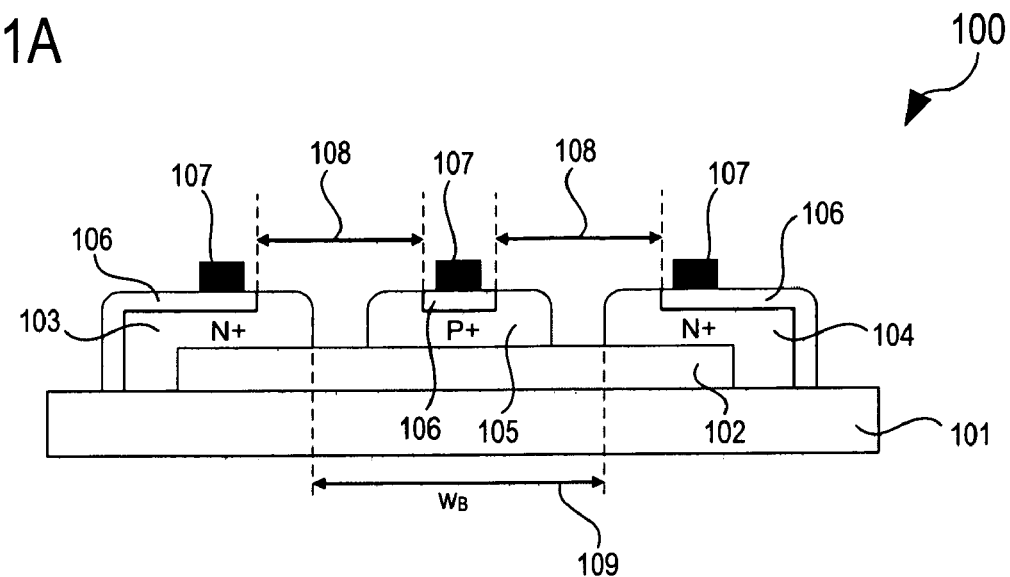
FIG. 1A shows a bipolar transistor in accordance with an embodiment.

FIG. 1A shows a bipolar transistor 100 in accordance with an embodiment. The bipolar transistor 100 includes a body region 102. In accordance with one embodiment, the body region 102 may have a fin structure. In other words, in accordance with an embodiment, the body region 102 may include at least one narrow fin or fin portion having sidewalls and a top surface. In accordance with an alternative embodiment, the body region 102 may have a planar structure. In other words, in accordance with an embodiment, the body region 102 may include or may be configured as a planar layer.

In accordance with an embodiment, the bipolar transistor 100 may be arranged over a substrate 101, as shown. In this application, the term "over" or "formed over" may include both the case that a first layer (or structure) is formed on a second layer (or structure), with direct physical contact to the second layer (or structure) below, and the case that the first layer is formed above the second layer, with one or more intervening layers (or structures) formed between the first and second layers. In accordance with one embodiment, the substrate 101 may be configured as a semiconductor substrate, e.g. as a silicon substrate (for example, as a silicon bulk substrate) or as a silicon-on-insulator (SOI) substrate, although other suitable substrates may be used in accordance with other embodiments. In case that the bipolar transistor 100 is arranged on or above an SOI substrate, the body region 102 may be arranged on a buried oxide (BOX) layer of the SOI substrate and may be formed from a thin silicon top layer of the SOI substrate, in accordance with an embodiment. In case that the bipolar transistor 100 is arranged on or above a silicon bulk substrate, the body region 102 may be formed from a silicon layer near the surface of the silicon bulk substrate, in accordance with an embodiment. Furthermore, in case of a silicon bulk substrate, the isolation of different, electrically independently operated body structures may, for example, be achieved by means of a depletion region, which may be formed between the lower part of the body and the underlying substrate.

The bipolar transistor 100 further includes a first terminal region 103 formed at least over a first portion of the body region 102 and configured as a first emitter/collector terminal region, a second terminal region 104 formed at least over a second portion of the body region 102 and configured as a second emitter/collector terminal region, and a third terminal region 105 formed at least over a third portion of the body region 102 and configured as a base terminal region.

In case that the body region 102 has a fin structure or fin, the first, second and third terminal regions 103, 104, 105 may in each case be formed at least partially over portions of the sidewalls and top surface of the fin structure.

The first terminal region 103, the second terminal region 104 and the third terminal region are 105 in each case formed as an epitaxially grown region. In other words, the first, second and third terminal regions 103, 104 and 105 (clearly, emitter, collector and base terminal regions of the bipolar transistor 100) may have been formed by means of an epitaxial growth process, e.g. by means of a selective epitaxial growth (SEG) process using the crystalline material (e.g. silicon) of the body region 102 as seed material (e.g. seed silicon), as will be described herein below.

In accordance with an embodiment, the first and second terminal regions 103, 104 (i.e. the first and second emitter/collector terminal regions) may be doped with doping atoms of a first conductivity type, and the third terminal region 105 (i.e. the base terminal region) may be doped with doping atoms of a second conductivity type different from the first conductivity type. For example, in accordance with one embodiment, the first and second terminal regions 103, 104 may be n-doped, for example heavily n-doped, e.g. n+ doped (as shown in FIG. 1A), and the third terminal region 105 may be p-doped, for example heavily p-doped, e.g. p+ doped (as shown in FIG. 1A). Clearly, in accordance with this embodiment, the bipolar transistor 100 is configured as an NPN transistor. In accordance with an alternative embodiment, the doping of the first, second and third terminal regions 103, 104, 105 may be reversed such that a PNP transistor may be obtained. In accordance with an embodiment, the doping of the first, second and third terminal regions 103, 104, 105 may be achieved using suitable dopant species such as, for example, boron (for p-type doping) or arsenic or phosphorous (for n-type doping).

In accordance with an embodiment, the body region 102 (e.g. the seed silicon) may be doped, e.g. lightly doped with any doping type, i.e., lightly n-doped (e.g. n− doped) or lightly p-doped (e.g. p− doped). In accordance with one embodiment, a PNP transistor may be provided with an n− doped body region 102.

In accordance with an alternative embodiment, the body region 102 may be undoped, in other words, have an intrinsic conductivity. Clearly, in accordance with an embodiment, the body region 102 may be configured as a lightly doped (or intrinsic) body region of the bipolar transistor 100, and the first, second and third terminal regions 103, 104, 105 may include or define heavily doped emitter, collector and base terminal regions of the bipolar transistor 100.

In accordance with the embodiment shown in FIG. 1A, the third terminal region 105 (i.e. the base terminal region) is arranged between the first and second terminal regions 103, 104 (i.e. the first and second emitter/collector terminal regions), wherein the third terminal region 105 is spaced apart from the first and second terminal regions 103, 104. In other words, the third terminal region 105 is laterally separated from both the first terminal region 103 and the second terminal region 104. This may, for example, be achieved by the use of one or more masks during the epitaxial growth of the terminal regions, as will be described herein below.

In accordance with an embodiment, a part of a surface area of the first terminal region 103, and/or a part of a surface area of the second terminal region 104, and/or a part of a surface area of the third terminal region 105 may be silicided. In other words, a silicide layer 106 may be formed within surface areas of at least one of the first, second and third terminal regions 103, 104, 105 by means of a silicidation process, as shown in FIG. 1A. The silicide 106 may serve to form a low-ohmic connection to one or more terminal contacts 107, which may be formed on the first, second and third terminal regions 103, 104, 105 (e.g. on the silicided portions thereof), as shown in FIG. 1A. In accordance with an embodiment, the silicidation or silicide 106 formation may be blocked across any pn-junction boundary in the transistor 100 (e.g. using one or more silicide blocking masks) in order to prevent possible electrical shorts in the device. The silicide-blocked regions are denoted by double arrows 108 in FIG. 1A. Clearly, the double arrows 108 may indicate the silicide blocking mask.

Clearly, FIG. 1A shows an embodiment of a bipolar transistor 100 having a lateral geometry with the base contact placed in the center between emitter and collector of the transistor 100. Thus a relatively large base width may be obtained, as is shown in FIG. 1A, in which the base width $w_B$ is denoted by double arrow 109. As shown, the base width $w_B$ may extend from the edge of the first terminal region 103 (first emitter/collector terminal region) to the edge of the second terminal region 104 (second emitter/collector terminal region).

Figure 1B:
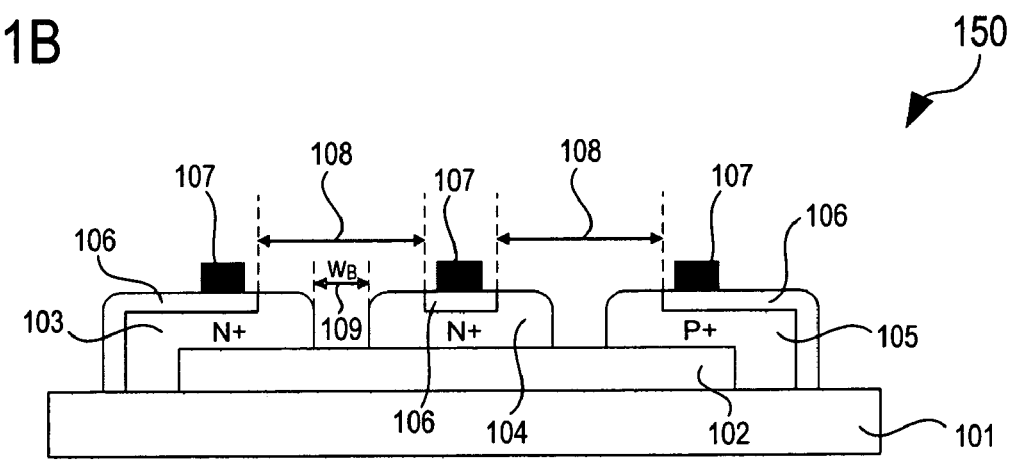
FIG. 1B shows a bipolar transistor in accordance with another embodiment.

FIG. 1B shows a bipolar transistor 150 in accordance with another embodiment. The bipolar transistor 150 is different from the bipolar transistor 100 shown in FIG. 1A, in that the second terminal region 104 (i.e., the second emitter/collector terminal region) is arranged between the first terminal region 103 (i.e. the first emitter/collector terminal region) and the third terminal region 105 (i.e. the base terminal region) of the transistor 150. Clearly, in the bipolar transistor 150 in accordance with the embodiment shown in FIG. 1B, the placement of the second emitter/collector terminal region and the base terminal region is reversed compared to the bipolar transistor 100 shown in FIG. 1A. That is, in the bipolar transistor 150, emitter and collector are arranged adjacent to one another (but spaced apart). Thus, a relatively short base width may be obtained, which in this case is defined by the gap between emitter and collector of the transistor 150, as is shown in FIG. 1B, in which the base width $w_B$ is denoted by double arrow 109.

FIG. 2A to FIG. 2E show a method for producing a bipolar transistor in accordance with an embodiment.

Figure 2A:
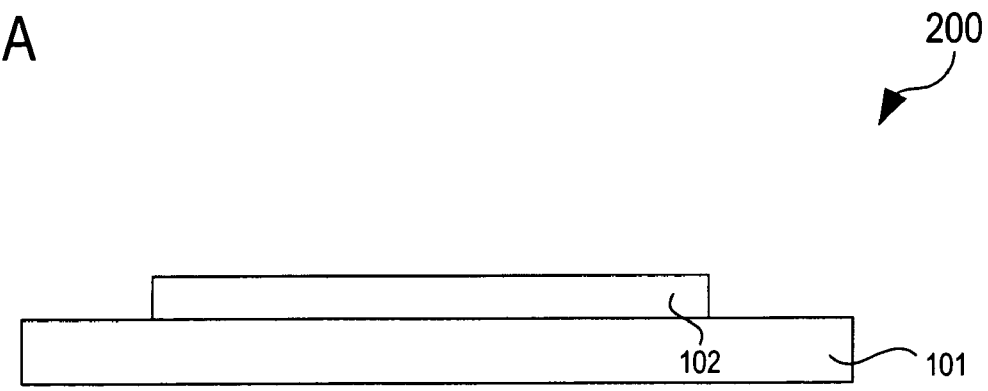
FIGS. 2A to 2E show a method for producing a bipolar transistor in accordance with another embodiment.

FIG. 2A shows in a cross-sectional view 200 that a body region is formed over a substrate 101. In accordance with one embodiment, the body region 102 may have a fin structure. In other words, in accordance with an embodiment, the body region 102 may include at least one narrow fin or fin portion having sidewalls and a top surface. In accordance with an alternative embodiment, the body region 102 may have a planar layer structure. In other words, in accordance with an embodiment, the body region 102 may include or may be configured as a planar layer. The substrate 101 may, for example, be configured in accordance with one of the embodiments described herein above in connection with FIG. 1A. In the following, it is assumed that the substrate 101 is configured as an SOI substrate with the body region 102 being formed from a thin silicon top layer of the SOI substrate and arranged on a buried oxide (BOX) layer of the SOI substrate. Thus, the body region 102 includes silicon material, also referred to as seed silicon in the following.

In accordance with an embodiment, the body region 102 may be doped, e.g. lightly doped with any doping type (i.e., p-doped or n-doped), e.g. p– doped or n– doped. Alternatively, the body region 102 may be undoped or have an intrinsic conductivity.

Figure 2B:
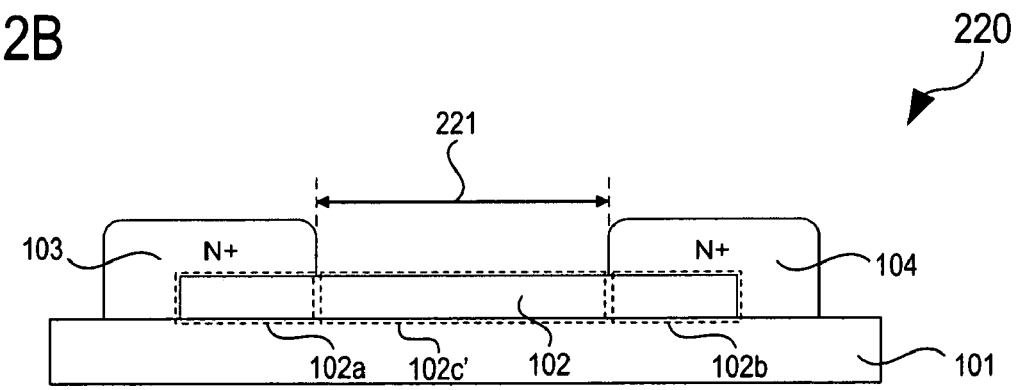

FIG. 2B shows in a cross-sectional view 220 that a first terminal region 103 is formed over a first portion 102a of the body region 102 and a second terminal region 104 is formed over a second portion 102b of the body region 102. In case that the body region 102 has a fin structure, the first and second terminal regions 103, 104 may in each case be formed at least partially over portions of the sidewalls and the top surface of the fin structure.

The first and second terminal regions 103, 104 are formed over the seed silicon of the body region 102 by means of a first selective epitaxial growth (SEG) process. In other words, the first and second terminal regions 103, 104 are formed by growing an epitaxial silicon layer selectively over exposed portions of the body region 102. In accordance with an embodiment, the first and second portions 102a, 102b, over which the first and second terminal regions 103, 104 are formed or deposited during the first SEG process, respectively, may correspond to end portions of the body region 102, as shown in FIG. 2B, while a center portion 102c' of the body region 102 may remain free from SEG silicon. This may be achieved by covering the center portion 102c' with a mask (e.g. a hard mask such as, for example, a nitride hard mask) during the SEG process, which may block the formation of SEG silicon over the center portion 102c' of the body region 102. The SEG blocked area is indicated by double arrow 221 in FIG. 2B.

The first and second terminal regions 103, 104 clearly serve as first and second emitter/collector regions of the bipolar transistor to be formed.

In accordance with the embodiment shown in FIG. 2B, the first and second terminal regions 103, 104 are highly n-doped (n+ doped). Thus, an NPN bipolar transistor having n+ doped emitter and collector regions may be formed. Alternatively, the first and second terminal regions 103, 104 may be p-doped, such that a PNP bipolar transistor having p-doped (e.g. p+ doped) emitter and collector regions may be formed.

In accordance with an embodiment, the doping of the first and second terminal regions 103, 104 may be carried out in-situ. In other words, the doping may be carried out during the first SEG process. That is, a doped silicon layer may grow epitaxially on the body region 102. In accordance with an alternative embodiment, the doping of the first and second terminal regions 103, 104 may be carried out after the first SEG process. That is, in accordance with this embodiment, an undoped silicon layer may be epitaxially grown on the body region 102 and may subsequently be doped, e.g. by means of an ion implantation process. In this case, the mask (e.g. a nitride hard mask) that may have been used during the first SEG process for blocking the SEG growth in the area 221, may additionally be used as a mask during the doping of the first and second terminal regions 103, 104, in accordance with an embodiment.

Figure 2C:
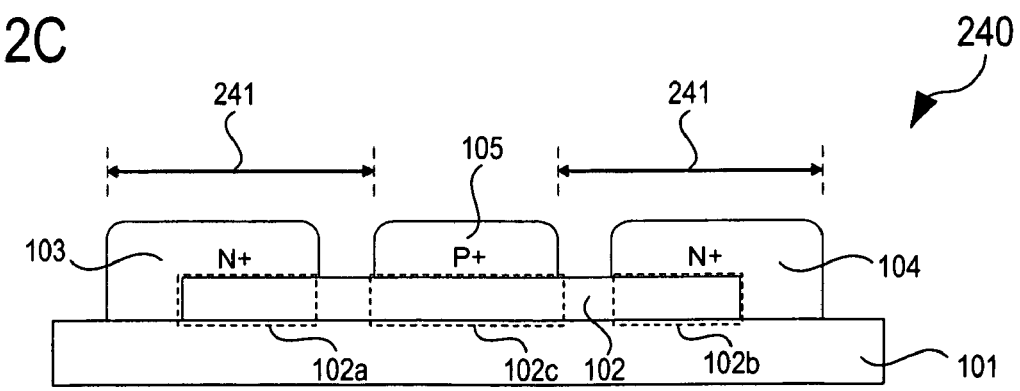

FIG. 2C shows in a cross-sectional view 240 that a third terminal region 105 is formed over a third portion 102c of the body region 102 by means of a second selective epitaxial growth (SEG) process. In accordance with this embodiment, the third portion 102c is part of the center portion 102c' of the body region 102, and the third terminal region 105 is formed between the first and second terminal regions 103, 104 and separated therefrom. Clearly, a base terminal region (i.e. the third terminal region 105) is formed by epitaxially growing a silicon layer selectively on an exposed portion of the body region 102 between the emitter and collector terminal regions (i.e., first and second terminal regions 103, 104) of the bipolar transistor to be formed. During the SEG growth of the third terminal region 105, the formation of silicon on and directly adjacent to the first and second terminal regions 103, 104 may be blocked, e.g. by means of a blocking mask (e.g. a hard mask such as, for example, a nitride hard mask). The SEG blocked area is indicated by double arrows 241 in FIG. 2C.

In accordance with the embodiment shown, the third terminal region 105 is heavily p-doped (p+ doped), such that a p-doped base terminal region is provided.

In accordance with an embodiment, the doping of the third terminal region 105 may be carried out as an in-situ doping, that is during the second SEG process, in a similar manner as described above for the first and second terminal regions 103, 104. That is, a silicon layer that is already doped (in-situ doped) may be epitaxially grown on the body region 102. In accordance with an alternative embodiment, the doping of the third terminal region 105 may be carried out after the second SEG process. That is, in accordance with this embodiment, an undoped silicon layer may be epitaxially grown on the body region 102 and may subsequently be doped, e.g. by means of an ion implantation process. In this case, the mask (e.g. a nitride hard mask) that may have been used during the second SEG process for blocking the SEG growth in the areas 241, may additionally be used as a mask during the doping of the third terminal region 105, in accordance with an embodiment.

Figure 2D:
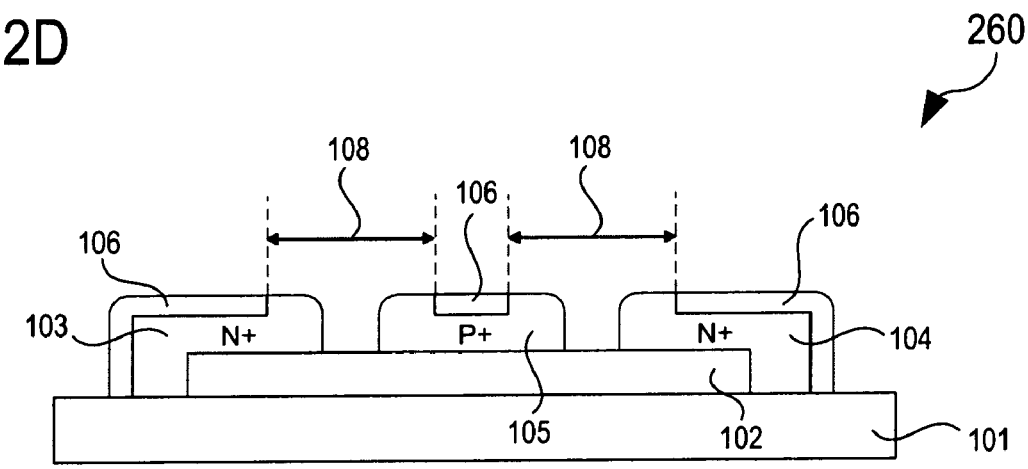

FIG. 2D shows in a cross-sectional view 260 that the first, second and third terminal regions 103, 104, 105 are silicided. In other words, parts of the surface areas of the terminal regions 103, 104, 105 are silicided, that is, transformed into silicide 106. The silicidation may serve to form low-ohmic connections to terminal contacts 107 that may be formed on the terminal regions 103, 104, 105 (cf. FIG. 2E). In accordance with an embodiment, the silicidation may be blocked (e.g. by means of a silicide blocking mask) across any pn-junction boundary in order to prevent potential short-circuits in the device. The silicide-blocked areas are denoted by double arrows 108 in FIG. 2D.

Figure 2E:
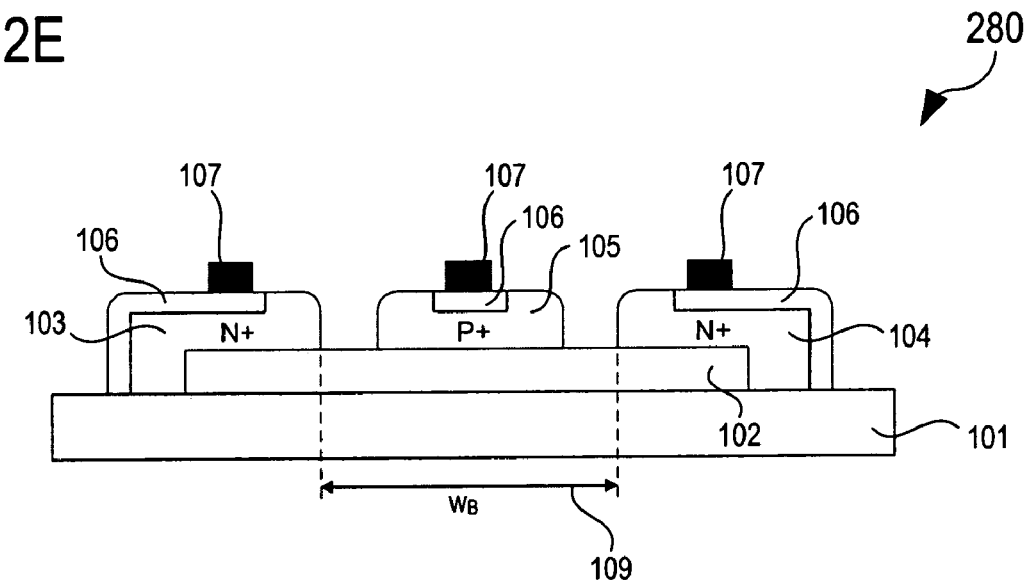

FIG. 2E shows in a cross-sectional view 280 that terminal contacts 107 are formed on the silicided portions of the first, second and third terminal regions 103, 104, 105 in order to make electrical contact to the terminal regions 103, 104, 105.

Clearly, by means of the method in accordance with the embodiment described above in connection with FIG. 2A to FIG. 2E, a lateral bipolar transistor for SOI and FinFET technologies similar to the bipolar transistor 100 shown in FIG. 1A may be obtained, with the base centered between the emitter and collector. The base width $w_B$ of the device is denoted by double arrow 109 in FIG. 2E. It is noted that a lateral bipolar transistor similar to the bipolar transistor 150 shown in FIG. 1B may be produced in a similar manner, with the difference that the n+ doped second terminal region 104 (i.e., the second emitter/collector region) of the bipolar transistor will be formed between the first and third terminal regions 103, 105, that is, between the first emitter/collector terminal region and the base terminal region of the bipolar transistor.

In the following, certain features and effects of the embodiments described herein above in connection with FIG. 1A to FIG. 2E will be described.

In accordance with some embodiments, a lateral bipolar transistor (also referred to as lateral bipolar junction (BJT) transistor) may be formed by use of Selective Epitaxial Growth (SEG). In accordance with an embodiment, two masked and in-situ doped SEG steps may be used: N+ SEG for the emitter/collector regions, and P+ SEG for the base contact. In accordance with some embodiments, different possibilities for placement of the base contact are described. For example, a bipolar transistor in accordance with one embodiment may have an ideal lateral geometry by placement of the base contact in the center, wherein a relatively large base width may be obtained (cf e.g. FIG. 1A). A bipolar transistor in accordance with another embodiment may have collector and emitter directly adjacent but spaced apart to form a short base width defined by a gap between collector and emitter SEG (cf. e.g. FIG. 1B). In both cases, silicidation may be applied to parts of the SEG surfaces to form a low-ohmic connection to terminal contacts, wherein the silicide may be blocked across any pn-junction boundary to prevent possible electrical shorts in the device.

FIG. 3A to FIG. 3E show a method for producing a bipolar transistor in accordance with another embodiment.

Figure 3A:
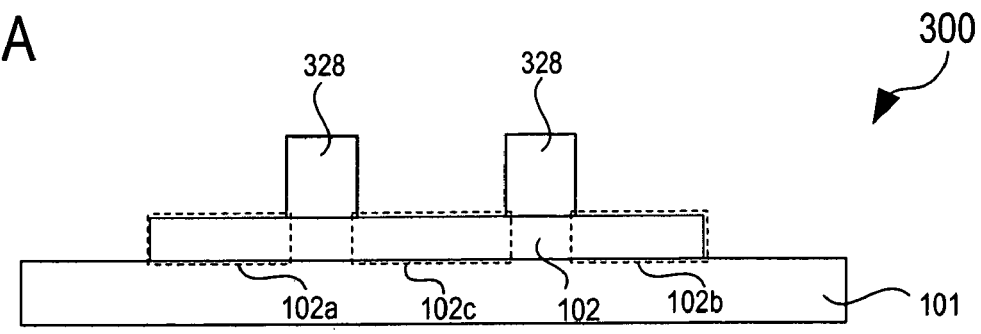
FIGS. 3A to 3E show a method for producing a bipolar transistor in accordance with another embodiment.

FIG. 3A shows in a cross-sectional view 300 that a body region 102 is formed over a substrate 101. In accordance with an embodiment, the body region 102 may have a fin structure. In other words, in accordance with an embodiment, the body region 102 may include at least one narrow fin or fin portion having sidewalls and a top surface. In accordance with an alternative embodiment, the body region 102 may have a planar structure. In other words, in accordance with an embodiment, the body region 102 may include or may be configured as a planar layer. The substrate 101 may, for example, be configured in accordance with one of the embodiments described herein above in connection with FIG. 1A. In the following, it is assumed that the substrate 101 is configured as an SOI substrate with the body region 102 being formed from a thin silicon top layer of the SOI substrate and arranged on a buried oxide (BOX) layer of the SOI substrate. Thus, the body region 102 includes silicon material ("seed silicon").

In accordance with an embodiment, the body region 102 may be doped, e.g. lightly doped with any doping type (i.e. p-doped or n-doped), e.g. p− doped or n− doped. Alternatively, the body region 102 may be undoped or have an intrinsic conductivity.

FIG. 3A further shows that hard masks (e.g. nitride hard masks) 328 are formed on the body region 102 such that a first portion 102a, a second portion 102b and a third portion 102c of the body region 102 remain exposed (in other words, uncovered). The hard masks 328 may serve to block the formation of silicon in the areas covered by the hard masks 328 during a subsequent SEG process, as described herein below.

Figure 3B:
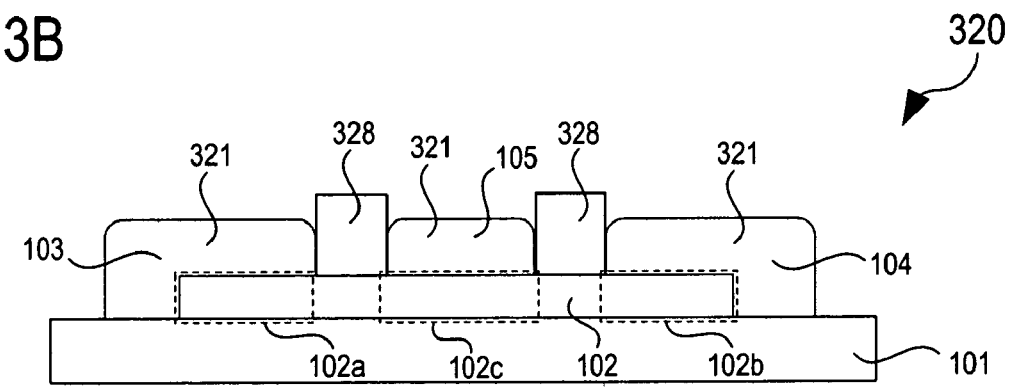

FIG. 3B shows in a cross-sectional view 320 that a silicon layer 321 is selectively grown on the exposed first, second and third portions 102a, 102b, 102c of the body region 102 by means of a selective epitaxial growth (SEG) process such that a first terminal region 103 is formed over the first portion 102a, a second terminal region 104 is formed over the second portion 102b, and a third terminal region 105 is formed over the third portion 102c of the body region 102. The first terminal region 103 may serve as a first emitter/collector terminal region, the second terminal region 104 may serve as a second emitter/collector terminal region, and the third terminal region 105 may serve as a base terminal region of the bipolar transistor to be produced. Clearly, in accordance with this embodiment, first and second emitter/collector terminal regions and a base terminal region are formed by a common selective epitaxial growth process.

Figure 3C:
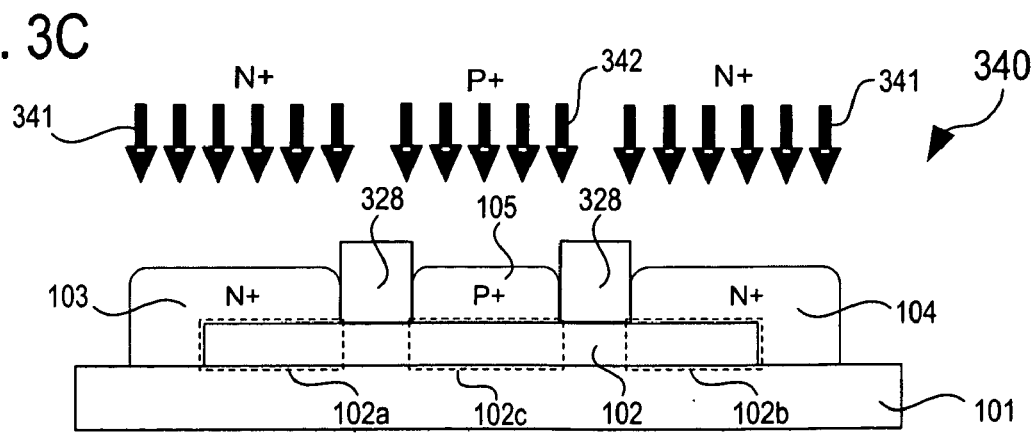

FIG. 3C shows in a cross-sectional view 340 that the first and second terminal regions 103, 104 are highly n-doped (n+ doped) by means of a first dopant implantation (denoted by arrows 341) using suitable n-type dopant species, and that the third terminal region 105 is highly p-doped (p+ doped) by means of a second implantation (denoted by arrows 342) using suitable p-type dopant species. It is noted, that the order of the first and second dopant implantations 341, 342 is arbitrary. That is, the first dopant implantation 341 may be carried out before the second dopant implantation 342, and vice versa.

By means of the first and second dopant implantations 341, 342 highly n-doped first and second emitter/collector terminal regions 103, 104 and a highly p-doped base terminal region 105 are formed, which may serve as emitter, collector and base of an NPN transistor. In accordance with an alternative embodiment, the doping types of the terminal regions 103, 104, 105 may be reversed such that a PNP transistor may be provided.

It is noted that by means of the first dopant implantation 341, the first and second portions 102a, 102b of the body region 102 located below the first and second terminal regions 103, 104 will also be highly n-doped (n+ doped). In other words, the former body seed silicon will be n+ doped in the first and second portion 102a, 102b of the body region 102. Similarly, by means of the second dopant implantation 342, the third portion 102c of the body region 102 located below the third terminal region 105 will be highly p-doped (p+ doped). That is, the former body seed silicon will be p+ doped in the third portion 102c of the body region 102.

Figure 3D:
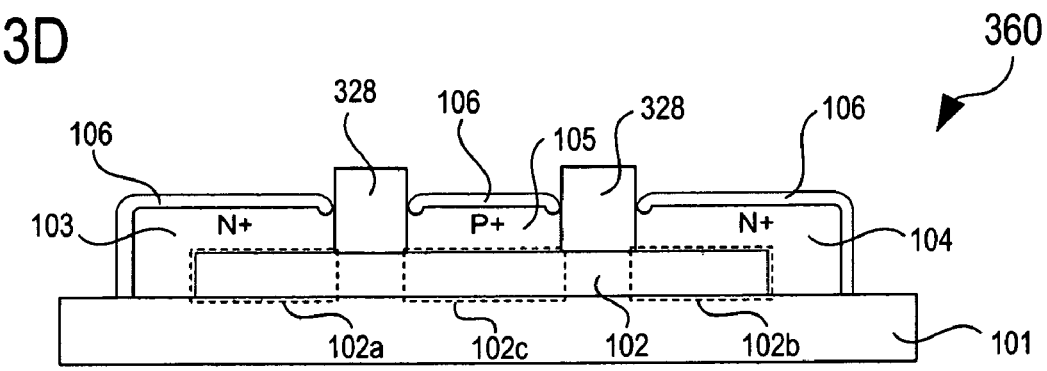

FIG. 3D shows in a cross-sectional view 360 that the first, second and third terminal regions 103, 104, 105 are silicided. That is, a silicide layer 106 is formed within surface areas of the terminal regions 103, 104, 105, as shown in the figure. During silicidation of the terminal regions 103, 104, 105, the hard masks 328 may serve to block formation of silicide 106 in the regions between the terminal regions 103, 104, 105, such that e.g. potential short-circuits in the device may be prevented.

Figure 3E:
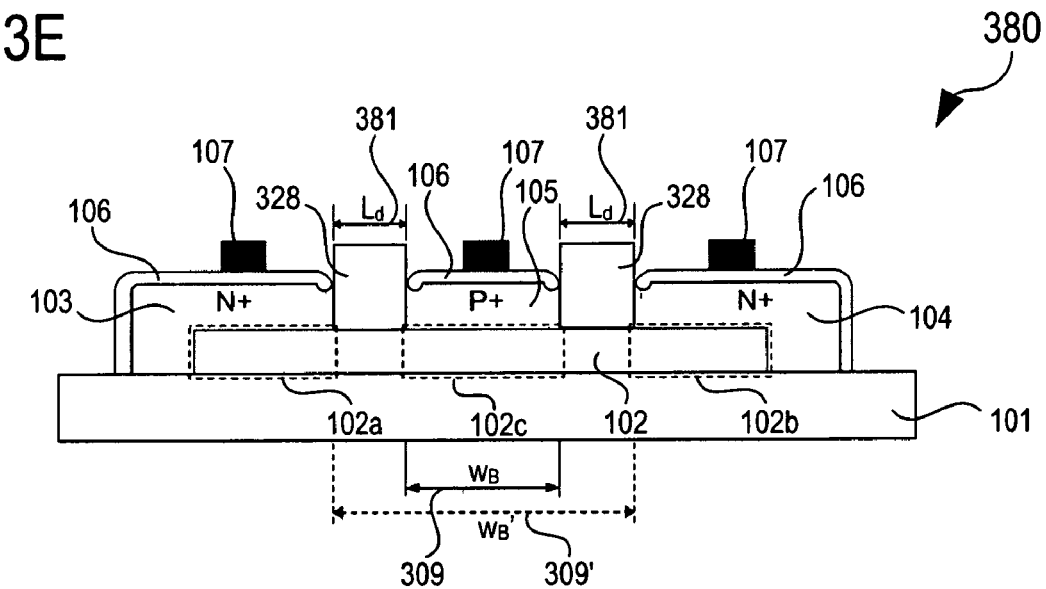

FIG. 3E shows in a cross-sectional view 380 that terminal contacts 107 are formed on the silicided first, second and third terminal regions 103, 104, 105 in order to make electrical contact to the terminal regions 103, 104, 105.

Clearly, by means of the method in accordance with the embodiment described above in connection with FIG. 3A to FIG. 3E, a lateral bipolar transistor for SOI and FinFET technologies may be obtained, with the base centered between the emitter and collector and having a high base doping. For the case that the seed silicon of the body region 102 is of n-type, the base width $w_B$ of the device is indicated by double arrow 309, and for the case that the seed silicon is intrinsic or of p-type, the base width $w_B'$ is indicated by double arrow 309'. FIG. 3E further shows the diode lengths $L_d$ (indicated by double arrows 381) between the n+ doped emitter/collector terminal regions 103, 104 and the p+ doped base terminal region 105.

In the following, certain features and effects of the embodiments described herein above in connection with FIG. 3A to FIG. 3E are described.

FIG. 3A to FIG. 3E show a lateral bipolar device and processing of a lateral bipolar device for SOI and FinFET technologies in accordance with an embodiment. In accordance with embodiment, only one SEG is used which may be doped afterwards. To only locally apply the SEG, hard masks (e.g. nitride hard masks) may be used which at the same time may also serve for masking a silicidation step. The lateral bipolar transistor may have a high base doping in the center region and a large base width. This device may therefore be suitable e.g. as an ESD protection device where low bipolar current gains are applied for tuning e.g. the open base breakdown voltage BVceo to relatively high values.

In accordance with another embodiment, a lateral bipolar transistor having the emitter (or collector) arranged between the collector (or emitter) and the base may be produced in a similar manner as described herein above in connection with FIG. 3A to FIG. 3E, with the difference that the second terminal region (second emitter/collector terminal region) will be formed between the first terminal region (first emitter/collector terminal region) and the third terminal region (base terminal region).

Figure 4A:
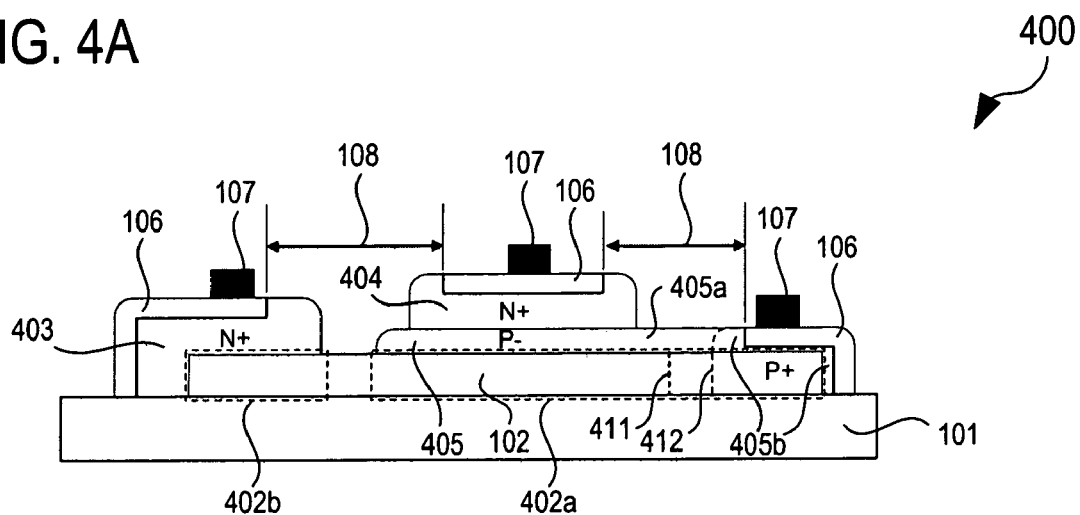
FIG. 4A shows a vertically integrated electronic device in accordance with another embodiment.

FIG. 4A shows a vertically integrated electronic device 400 in accordance with another embodiment. The electronic device 400 includes a first terminal region 403, a second terminal region 404 and a third terminal region 405. The second terminal region 404 is arranged over a portion of the third terminal region 405. The first, second and third terminal regions 403, 404, 405 are in each case formed as epitaxially grown regions. That is, the first, second and third terminal regions 403, 404, 405 are in each case formed by an epitaxial growth process as will be described herein below.

The electronic device 400 is configured as a bipolar transistor, also referred to as vertical bipolar transistor or vertical bipolar junction transistor (BJT), wherein the first terminal region 403 is configured as a collector terminal region, the second terminal region 404 is configured as an emitter terminal region, and the third terminal region 405 is configured as a base terminal region of the transistor. Clearly, the emitter terminal region (i.e., the second terminal region 404) of the transistor is arranged over a portion of the base terminal region (i.e., the third terminal region 405). In accordance with an alternative embodiment, the first terminal region 403 may be configured as the emitter terminal region of the transistor, and the second terminal region 404 may be configured as the collector terminal region of the transistor.

In accordance with an embodiment, the first and second terminal regions 403, 404 (that is, the collector and emitter terminal regions in accordance with an embodiment) may be heavily n-doped (e.g. n+ doped), as shown in FIG. 4A. In accordance with another embodiment, a first portion 405a of the third terminal region 405 (that is, of the base terminal region) may be lightly p-doped (e.g. p− doped) and a second portion 405b of the third terminal region 405 may be heavily p-doped (e.g. p+ doped), as shown in FIG. 4A. Thus, in accordance with the embodiment shown, the vertical bipolar transistor 400 is configured as an NPN device with a vertical pn-junction formed between the third terminal region 405 (base terminal region) and the second terminal region 404 (emitter terminal region). In accordance with an alternative embodiment, the vertical bipolar transistor 400 may be configured as a PNP device. In this case, the doping of the first, second and third terminal regions 403, 404, 405 may be reversed.

In accordance with an embodiment, the doping of at least one of the first, second and third terminal regions 403, 404, 405 may be carried out as in-situ doping during the SEG growth, as will be described herein below. In accordance with an alternative embodiment, the doping may be carried out after the SEG growth. That is, an undoped layer may be deposited and may subsequently be doped (e.g. by means of an ion implantation process).

In accordance with an embodiment, the vertical bipolar transistor 400 may include a body region 102 that may be arranged over a substrate 101, as shown in FIG. 4A. The body region 102 may include or may be made of silicon. In accordance with one embodiment, the body region 102 may have a fin structure. In other words, in accordance with an embodiment, the body region 102 may include at least one narrow fin or fin portion having sidewalls and a top surface. In accordance with an alternative embodiment, the bipolar transistor may have a planar structure. In other words, in accordance with an embodiment, the body region 102 may include or may be configured as a planar layer. The substrate 101 may be configured in a similar manner as described herein above with other embodiments, for example as an SOI substrate or as a silicon bulk substrate. In the following, it will be assumed that the substrate 101 is configured as an SOI substrate with the body region 102 being arranged on a thin insulating layer (e.g. buried oxide (BOX) layer) of the SOI substrate.

In accordance with an embodiment, the third terminal region 405 may be arranged over a first portion 402a of the body region 102 and the first terminal region 403 may be arranged over a second portion 402b of the body region 102, wherein the second portion 402b may be separated from the first portion 402a, as shown in FIG. 4A.

In accordance with an embodiment, a part of a surface area of the first terminal region 403, and/or a part of a surface area of the second terminal region 404, and/or a part of a surface area of the third terminal region 405 may be silicided. In other words, a silicide layer 106 may be formed within surface areas of the first, second and third terminal regions 403, 404, 405 by means of a silicidation process, as shown in FIG. 4A. The silicide 106 may serve to form a low-ohmic connection to one or more terminal contacts 107, which may be formed over the first, second and third terminal regions 403, 404, 405 (e.g. on the silicided portions thereof), as shown in FIG. 4A. In accordance with an embodiment, the silicidation or silicide 106 formation may be blocked across any pn-junction boundary in the vertical bipolar transistor 400 (e.g. using one or more silicide blocking masks) in order to prevent possible electrical shorts in the device. The silicide-blocked regions are denoted by double arrows 108 in FIG. 4A. Clearly, the double arrows 108 may indicate a silicide blocking mask opening.

In accordance with an embodiment, the body region 102 may be formed from p– doped, lightly n-doped (e.g. n– doped) or intrinsic (i) seed silicon. In addition, the second portion 402b of the body region 102, the portion of the body region 102 located between the first and second portions 402a, 402b of the body region 102, and a part of the first portion 402a of the body region 102 located below the second terminal region 404 may be lightly n-doped (e.g. n– doped), as shown in FIG. 4A. Clearly, the part of the body region 102 that is located to the left of line 411 in FIG. 4A may be lightly n-doped (e.g. n– doped), while the part of the body region 102 that is located between lines 411 and 412 in FIG. 4A may be lightly p-doped (e.g. p– doped), lightly n-doped (e.g. n– doped) or intrinsic body seed silicon.

In accordance with another embodiment, the part of the body region 102 that is located to the right of line 412 in FIG. 4A may be highly p-doped (e.g. p+ doped), as shown in FIG. 4A, or highly n-doped (e.g. n+ doped) in case that a PNP transistor is provided.

Figure 4B:
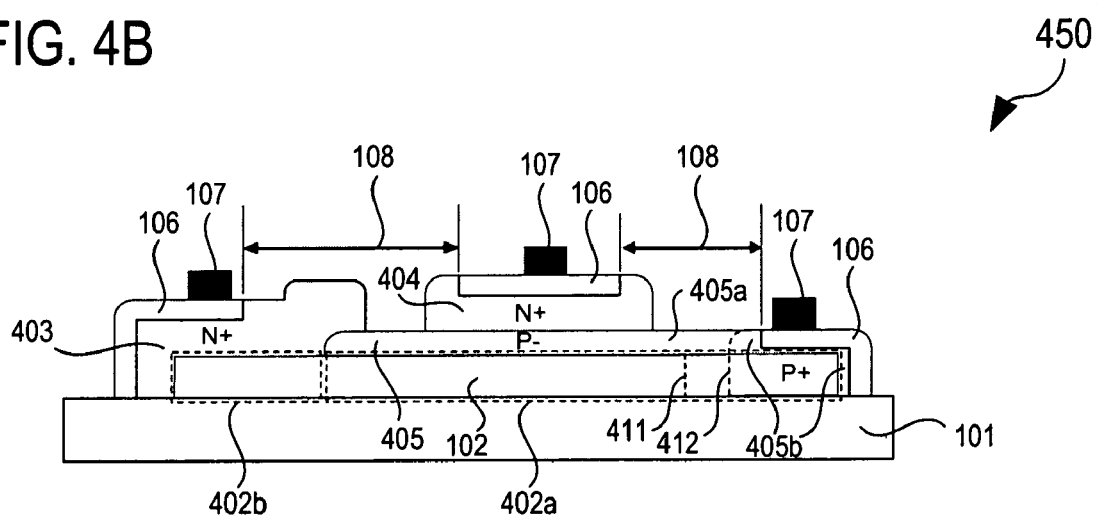
FIG. 4B shows a vertically integrated electronic device in accordance with another embodiment.

FIG. 4B shows a vertically integrated electronic device 450 in accordance with another embodiment. The electronic device 450 is configured as a vertical bipolar transistor and is different from the device 400 shown in FIG. 4A in that the first terminal region 403 (i.e. the collector terminal region of the transistor) adjoins and/or partially overlaps the third terminal region 405 (i.e., the base terminal region of the transistor). In other words, a part of the first terminal region 403 is grown on the third terminal region 405, wherein however a gap is present between the first and second terminal regions 403, 404, as shown in FIG. 4B.

In the following, certain features and effects of the embodiments described herein above in connection with FIG. 4A and FIG. 4B are described.

FIG. 4A and FIG. 4B show two embodiments of a vertical bipolar junction transistor (BJT) that may be created by SEG. In accordance with some embodiments, the BJT may include two consecutive photo-masked SEG steps: a thin SEG layer (having, for example, a thickness in the range from about 5 nm to 20 nm in accordance with some embodiments, e.g. 10 nm in one embodiment) with p- in-situ doping forming a narrow base region, and a thicker SEG layer (having, for example, a thickness in the range from about 10 nm to 60 nm in accordance with some embodiments) in-situ doped (n+ doped in accordance with the embodiments shown in FIGS. 4A and 4B) to form both collector region and emitter region of the transistor. In accordance with one embodiment, a spacing may be introduced between the base region and the collector region in order to allow for an improved or optimized vertical geometry of the base region (as shown in FIG. 4A). In accordance with an alternative embodiment, the collector contact (collector terminal region) may partially overlap the SEG of the base region (as shown in FIG. 4B). In this case, a lower collector resistance may be obtained by a more solid connection from the collector contact to the active transistor region. In addition, more robust thermal properties may be obtained by a larger thermal mass.

FIGS. 5A to 5G show a method for producing a vertically integrated electronic device such as, for example, the vertical BJT device 400 shown in FIG. 4A, in accordance with another embodiment.

Figure 5A:
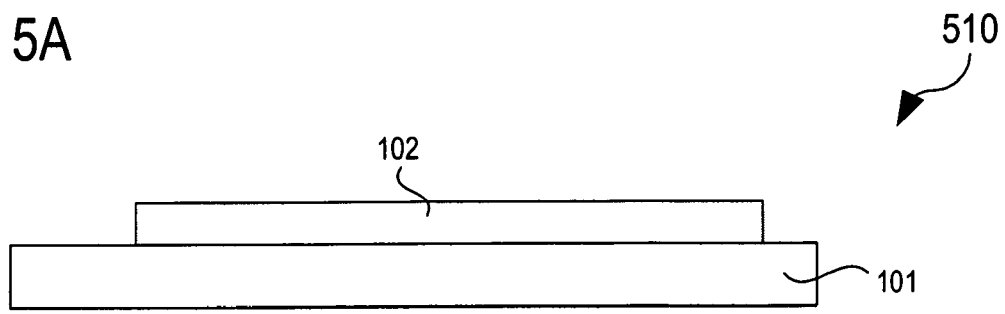
FIGS. 5A to 5G show a method for producing a vertically integrated electronic device in accordance with another embodiment.

FIG. 5A shows in a cross-sectional view 510 that a body region 102 may be formed over a substrate 101. In accordance with one embodiment, the body region 102 may have a fin structure. In other words, in accordance with an embodiment, the body region 102 may include at least one narrow fin or fin portion having sidewalls and a top surface. In accordance with an alternative embodiment, the body region 102 may have a planar structure. In other words, in accordance with an embodiment, the body region 102 may include or may be configured as a planar layer. The substrate 101 may, for example, be configured in accordance with one of the embodiments described herein above in connection with FIG. 1A. In the following, it is assumed that the substrate 101 is configured as an SOI substrate with the body region 102 being formed from a thin silicon top layer of the SOI substrate and arranged on an insulating layer (e.g. buried oxide (BOX) layer) of the SOI substrate. Thus, the body region 102 includes silicon material ("seed silicon"). In accordance with an embodiment, the body region 102 or seed silicon region may be formed from the silicon top layer of the SOI substrate using e.g. a photomask.

In accordance with an embodiment, the body region 102 seed silicon may be doped with any type (i.e., p-doped or n-doped), e.g. lightly p-doped (e.g. p– doped) or lightly n-doped (e.g. n– doped). In accordance with an alternative embodiment, the seed silicon may be undoped. In other words, the seed silicon may be of intrinsic type or have intrinsic conductivity.

Figure 5B:
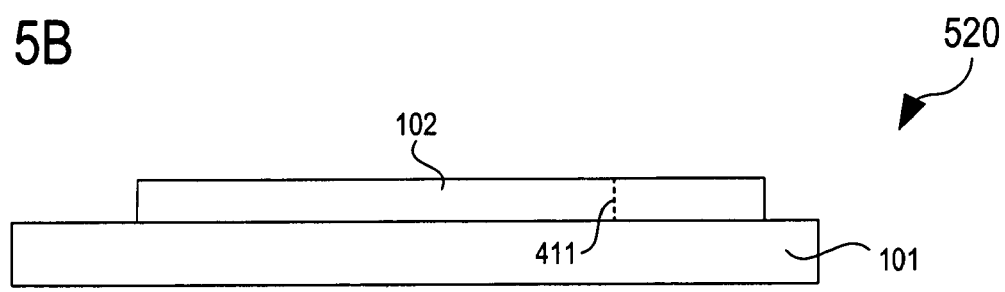

FIG. 5B shows in a cross-sectional view 520 that a portion of the body region 102 (seed silicon) that is located to the left of line 411 in FIG. 4B may be doped with doping atoms of a first conductivity type. In accordance with an embodiment, the first conductivity type may be an n-type conductivity type, e.g. in case that an NPN transistor will be provided. In accordance with an alternative embodiment, the first conductivity type may be a p-type conductivity type, e.g. in case that a PNP transistor will be provided. In accordance with the embodiment shown in FIG. 5B, the portion of the body region 102 located to the left of line 411 is n– doped.

In accordance with another embodiment, the doping may be achieved by means of an ion implantation process, e.g. an LDD (lightly doped drain) implantation in accordance with one embodiment, using for example a photomask to define the portion of the body region 102 to be doped.

Figure 5C:
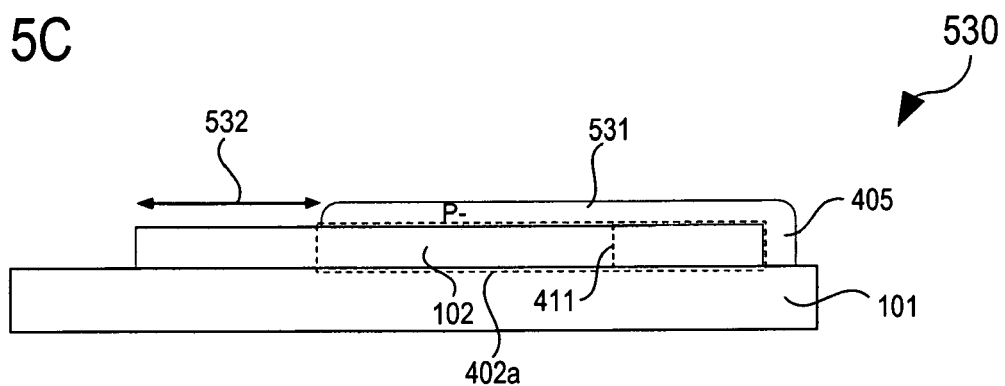

FIG. 5C shows in a cross-sectional view 530 that a silicon layer 531 may be epitaxially grown selectively on a first portion 402a of the body region 102. In accordance with an embodiment, the first portion 402a may include the n-, p- or intrinsic portion of the body region 102 located to the right of line 411 and a part of the n– doped portion located to the left of line 411, as shown in FIG. 5C. In case that the body region 102 has a fin structure, the silicon layer 531 may be formed over the sidewalls and over the top surface of the fin structure in the first portion 402a of the body region 102.

The epitaxial silicon layer 531 defines a third terminal region 405 of the bipolar transistor to be produced, wherein the third terminal region 405 may be configured as a base terminal region of the transistor. Clearly, in accordance with this embodiment, a base terminal region may be formed over the first portion 402a of the body region 102 by means of a selective epitaxial growth process, wherein the SEG growth may be blocked in an area indicated by double arrow 532 in FIG. 5C, for example by means of a suitable blocking mask (e.g. a hard mask such as, for example, a nitride hard mask, or a photomask or photoresist).

In accordance with an embodiment, the third terminal region 405 may be doped with doping atoms of a second conductivity type different from the first conductivity type. In accordance with an embodiment, the third terminal region 405 may be p-doped, for example lightly p-doped (e.g. p– doped), as shown in FIG. 5C. In accordance with an embodiment, the doping may be carried out in-situ, that is during the SEG growth of the silicon 531 of the third terminal region 405. In accordance with another embodiment, the silicon layer 531 may be grown as an undoped silicon layer and may be doped subsequently, e.g. by means of an ion implantation process. In other words, in accordance with this embodiment, the third terminal region 405 may be doped after the SEG process.

Figure 5D:
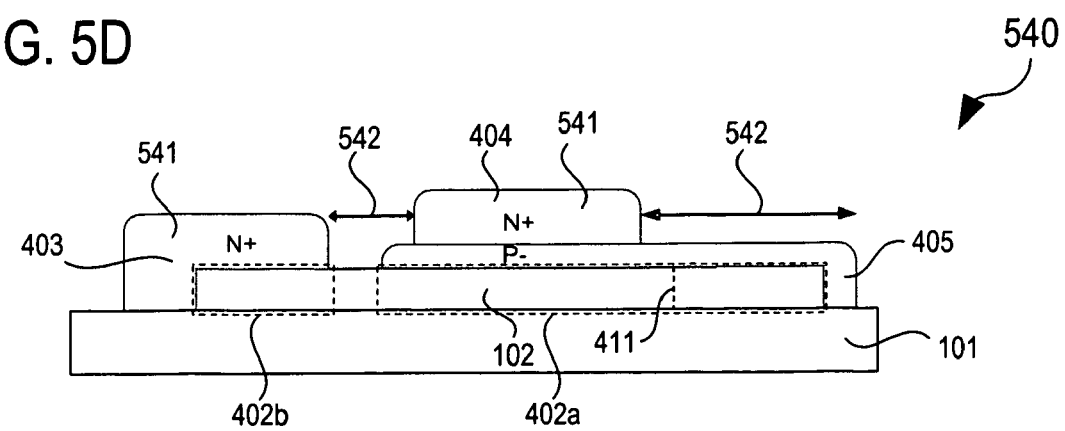

FIG. 5D shows in a cross-sectional view 540 that a second silicon layer 541 may be grown epitaxially selectively over a second portion 402b of the body region 102 and over a portion of the third terminal region 405. The second portion 402b of the body region may be part of the n-doped portion of the body region 102 located to the left of line 411, and may be separated from the first portion 402a of the body region 102, as shown in FIG. 5D. In case that the body region 102 has a fin structure, the second silicon layer 541 may be formed over the sidewalls and over the top surface of the fin structure in the second portion 402b of the body region 102. In accordance with an embodiment, the part of the second silicon layer 541 that is grown on the third terminal region 405 may be arranged above the n-doped portion of the body region 102 located to the left of line 411, as shown in FIG. 5D.

The part of the second epitaxial silicon layer 541 that is formed over the second portion 402b of the body region 102 defines a first terminal region 403, and the part of the second epitaxial silicon layer 541 that is formed over the portion of the third terminal region 405 defines a second terminal region 404 of the bipolar transistor to be produced, wherein the first terminal region 403 may be configured as a collector terminal region and the second terminal region 404 may be configured as an emitter terminal region of the transistor. Clearly, in accordance with this embodiment, collector and emitter terminal regions may be formed over the second portion 402b of the body region 102 and over the third terminal region 405 (base terminal region), respectively, by means of a common second selective epitaxial growth process, wherein the SEG growth may be blocked in areas indicated by double arrows 542 in FIG. 5D, for example by means of one or more suitable blocking masks (e.g. a hard mask such as, for example, a nitride hard mask, or a photomask or photoresist). As shown in FIG. 5D, the SEG growth may be blocked in an area located between the first and second terminal regions 403, 404 such that the first and second terminal regions 403, 404 are separated from one another. In accordance with an alternative embodiment, the first terminal region 403 may be configured as the emitter terminal region of the transistor and the second terminal region 404 may be configured as the collector terminal region of the transistor.

In accordance with an embodiment, the first and second terminal regions 403, 404 may be doped with doping atoms of the first conductivity type. In accordance with an embodiment, the first and second terminal regions 403, 404 may be n-doped, for example heavily n-doped (e.g. n+ doped), as shown in FIG. 5D. In accordance with an embodiment, the doping may be carried out in-situ, that is during the second SEG growth of the silicon 541 of the first and second terminal regions 403, 404. In other words, the silicon layer 541 may grow as an already doped layer. In accordance with another embodiment, the silicon layer 541 may be grown as undoped layer and may be doped subsequently, e.g. by means of an ion implantation process. In other words, in accordance with this embodiment, the first and second terminal regions 403, 404 may be doped after the second SEG process. In this case, the second portion 402b of the body region 102 located below the first terminal region 403 may also be doped (e.g. n+ doped).

Figure 5E:
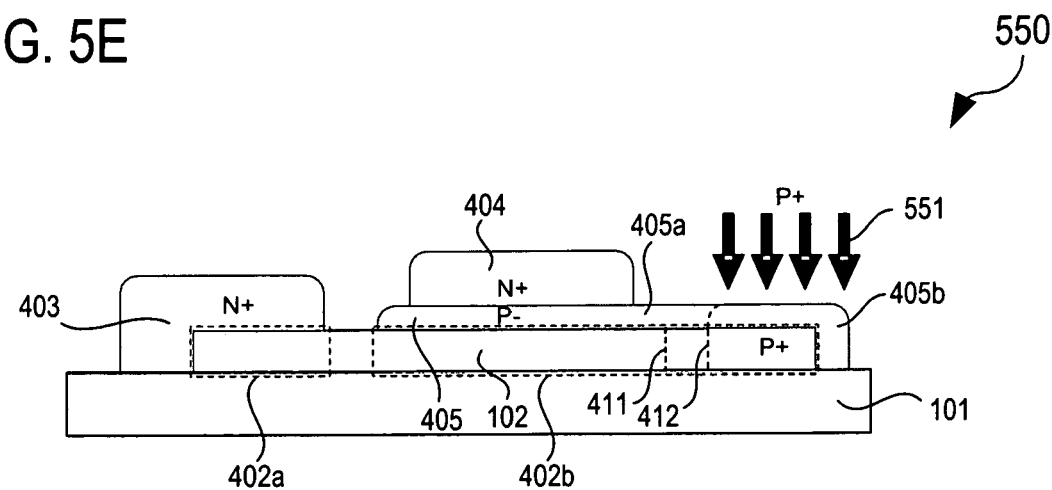

FIG. 5E shows in a cross-sectional view 550 that a second portion 405b of the third terminal region 405 may be heavily p-doped (p+ doped), e.g. by means of an ion implantation process (indicated by arrows 551 in FIG. 5E), while a first portion 405a of the third terminal region 405 may remain lightly p-doped (p− doped). In addition to the second portion 405b of the third terminal region 405, a portion of the body region 102 located below the second portion 405b of the third terminal region 405 may also be doped during the p+ doping 551, as shown in FIG. 5E. Clearly, in accordance with the embodiment shown in FIG. 5E, the portion of the body region 102 located to the right of line 412 may be p+ doped during the p+ doping 551. In accordance with an embodiment, the doping of the second portion 405b of the third terminal region 405 and of the portion of the body region 102 located therebelow may be carried out using a suitable doping mask (e.g. photomask).

Figure 5F:
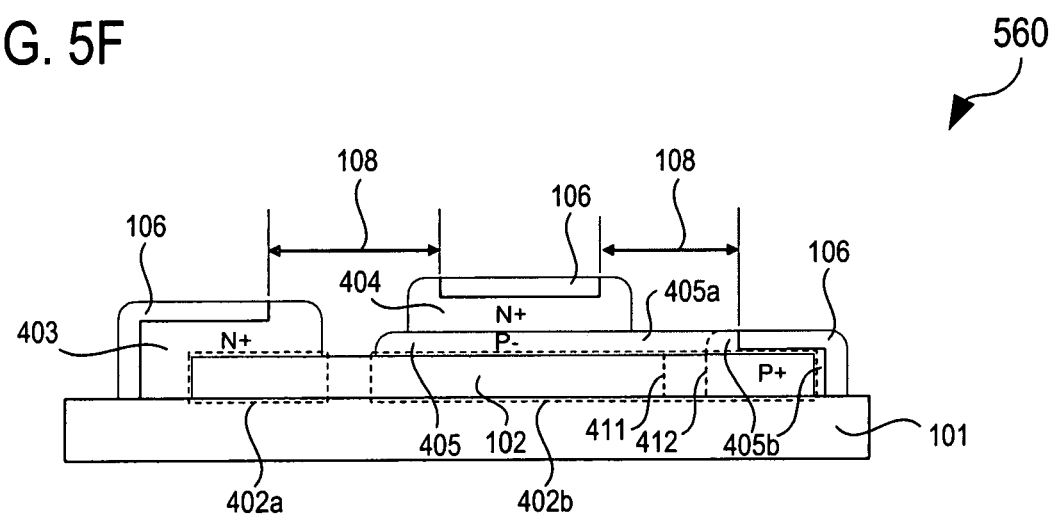

FIG. 5F shows in a cross-sectional view 560 that portions of the surface areas of the first, second and third terminal regions 403, 404, 405 may be silicided. In other words, a silicide layer 106 may be formed within surface portions of the terminal regions 403, 404, 405. In accordance with an embodiment, the silicidation may be blocked (for example, using a silicide blocking mask such as e.g. a photomask) across any pn-junctions in the device in order to prevent possible electrical shorts, as is shown in FIG. 5F, which shows silicide blocked areas indicated by double arrows 108.

Figure 5G:
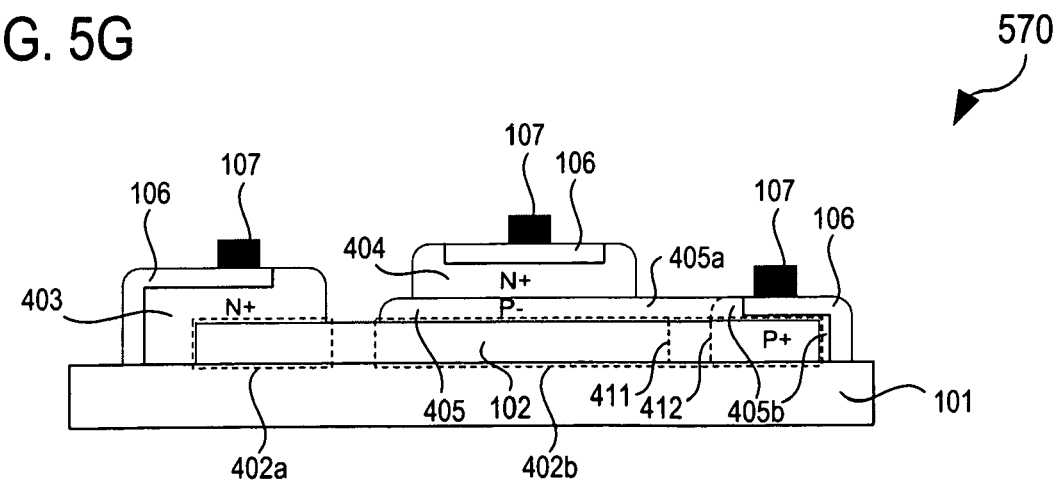

FIG. 5G shows in a cross-sectional view 570 that terminal contacts 107 may be formed on the silicided portions of the first, second and third terminal regions 403, 404, 405. The terminal contacts 107 may serve to make electrical contact to the terminal regions 403, 404, 405.

Clearly, by means of the method in accordance with the embodiment described above in connection with FIG. 5A to FIG. 5G, a vertical BJT device similar to the one in FIG. 4A may be formed in an SOI and/or FinFET process. In accordance with another embodiment, a vertical BJT device similar to the one shown in FIG. 4B may be formed in a similar manner as described above in connection with FIG. 5A to FIG. 5G, wherein the first terminal region 403 (collector terminal region) may be formed such that it adjoins or partially overlaps the third terminal region 405 (base terminal region) as shown in FIG. 4B.

FIG. 6 shows a method 600 for producing a vertical bipolar transistor (e.g. a vertical SOI BJT transistor or a vertical/lateral fin-type BJT transistor in accordance with one embodiment) in accordance with another embodiment.

In 610, an SOI wafer material is provided that includes a lightly doped or undoped silicon film over a buried oxide (BOX) layer.

In 620, a seed silicon region is formed from the silicon film of the SOI wafer. A lithographical process using e.g. a photomask may be used to define the seed silicon region.

In 630, a first portion of the seed silicon region is doped such that it has a first conductivity type. A lithographical process using e.g. a photomask may be used to define the portion of the seed silicon to be doped.

In 640, an in-situ doped silicon layer having a second conductivity type is grown over a second portion of the seed silicon region and over a part of the first portion of the seed silicon region by means of a first selective epitaxial growth (SEG) process. A lithographical process using e.g. a photomask may be used to define the regions, on which the silicon layer (also referred to as first SEG region) will be formed.

In 650, an in-situ doped silicon layer having the first conductivity type is grown over a portion of the first portion of the seed silicon region and over a first portion of the first SEG region by means of a second selective epitaxial growth (SEG) process. A lithographical process using e.g. a photomask may be used to define the regions, on which the silicon layer (also referred to as second SEG region) will be formed.

In 660, a second portion of the first SEG region is p+ doped. A lithographical process using e.g. a photomask may be used to define the portion of the first SEG region to be doped.

In 670, portions of both the first SEG region and the second SEG region are partially silicided. A lithographical process using e.g. a photomask may be used to define the portions of the first and second SEG regions to be silicided.

In 680, contacts are formed.

Figure 4C:
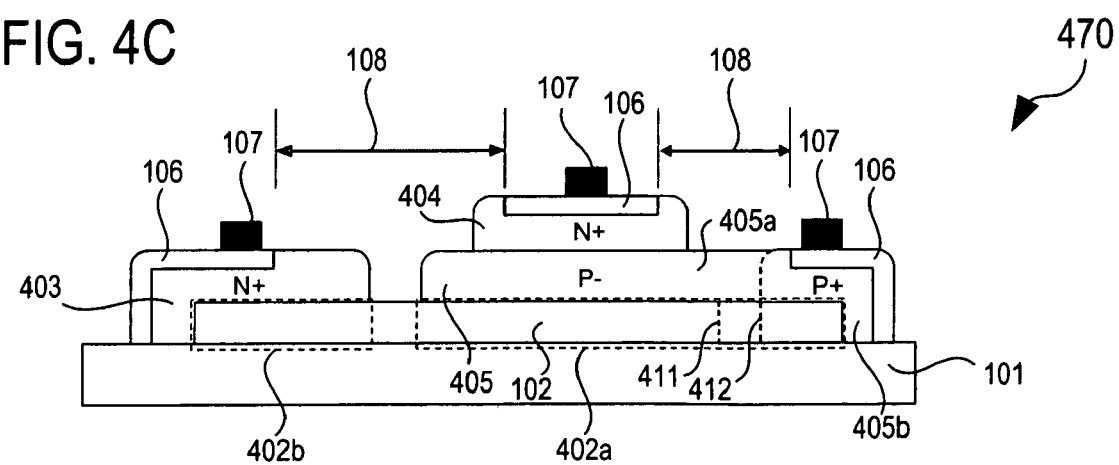
FIG. 4C shows a vertically integrated electronic device in accordance with another embodiment.

FIG. 4C shows a vertically integrated electronic device 470 in accordance with another embodiment. The electronic device 470 is configured as a vertical bipolar transistor (vertical BJT) and is different from the device 400 shown in FIG. 4A in that the second terminal region 404 (i.e. the emitter terminal region of the transistor) is made of a polysilicon material and that a single SEG process is used to form both the first terminal region 403 (i.e. the collector terminal region of the transistor) and the third terminal region 405 (i.e. the base terminal region of the transistor), as will be described herein below. In other words, the bipolar transistor 470 has an SEG layer as the bipolar base region and uses polysilicon as emitter material.

FIGS. 7A to 7G show a method for producing a vertically integrated electronic device such as, for example, the device 470 shown in FIG. 4C, in accordance with another embodiment.

Figure 7A:
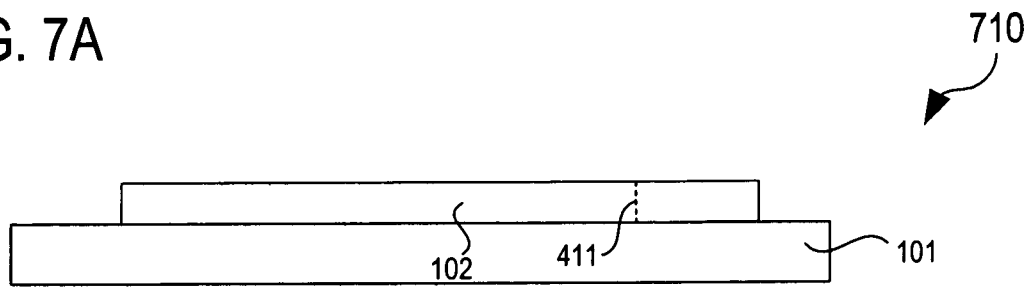
FIGS. 7A to 7G show a method for producing a vertically integrated electronic device in accordance with another embodiment.

FIG. 7A shows in a cross-sectional view 710 that a body region 102 may be formed over a substrate 101. In accordance with an embodiment, the body region 102 may include or may be made of seed silicon. In accordance with an embodiment, the body region 102 may have a fin structure. In other words, in accordance with an embodiment, the body region 102 may include or may be configured as a narrow fin or fin portion having sidewalls and a top surface. In accordance with an alternative embodiment, the body region 102 may have a planar structure. In other words, in accordance with an embodiment, the body region 102 may include or may be configured as a planar layer. In accordance with an embodiment, the part of the body region 102 seed silicon located to the right of line 411 in FIG. 7A may be undoped (alternatively, lightly p–doped or n-doped), and the part of the body region seed silicon located to the left of line 411 may be lightly n-doped (e.g. n-doped). The structure shown in FIG. 7A may be obtained in a similar manner as described herein above in connection with FIG. 5A and FIG. 5B.

Figure 7B:
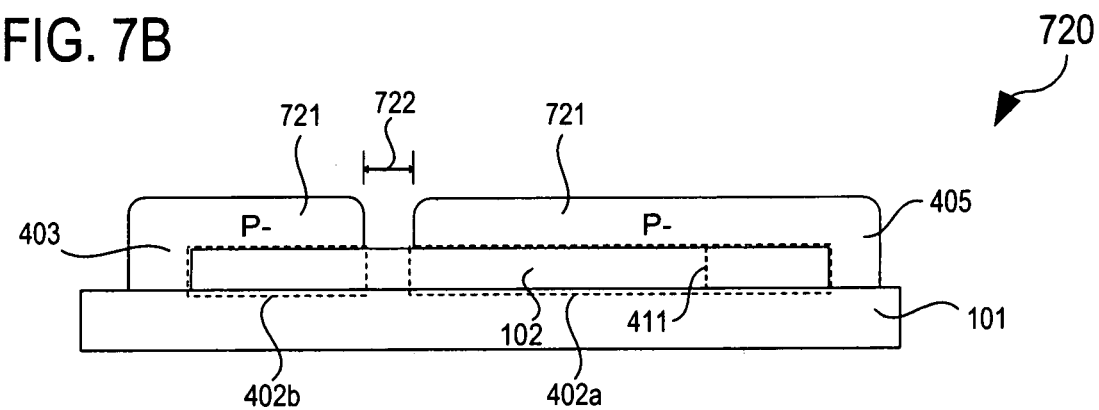

FIG. 7B shows in a cross-sectional view 720 that a silicon layer 721 may be epitaxially grown selectively over a first portion 402a and over a second portion 402b of the body region 102. In accordance with an embodiment, the first portion 402a may include the p– doped, n– doped or intrinsic portion of the body region 102 located to the right of line 411 and a part of the n– doped portion located to the left of line 411, as shown in FIG. 7B. In case that the body region 102 has a fin structure, the silicon layer 721 may be formed over the sidewalls and over the top surface of the fin structure in the first portion 402a and in the second portion 402b of the body region 102.

The epitaxial silicon layer 721 defines a first terminal region 403 and a third terminal region 405 of the bipolar transistor to be produced, wherein the first terminal region 403 may be configured as a collector terminal region and the third terminal region 405 may be configured as a base terminal region of the transistor. Clearly, in accordance with this embodiment, a collector terminal region and a base terminal region may be formed over the first portion 402a and over the second portion 402a of the body region 102, respectively, by means of a common selective epitaxial growth process, wherein the SEG growth may be blocked in an area between the collector and base terminal regions. The SEG blocked area is indicated by double arrow 722 in FIG. 7B. The SEG blocking may, for example, be achieved by means of a suitable blocking mask (e.g. a hard mask such as, for example, a nitride hard mask, or a photomask or photoresist).

In accordance with an embodiment, the epitaxial silicon layer 721 may be in-situ p– doped, as shown. That is, the third terminal region 405 and also the first terminal region 403 may be p– doped during the SEG. In accordance with an alternative embodiment, the silicon layer 721 may be grown as undoped layer and may be doped subsequently, e.g. by means of an ion implantation process.

Figure 7C:
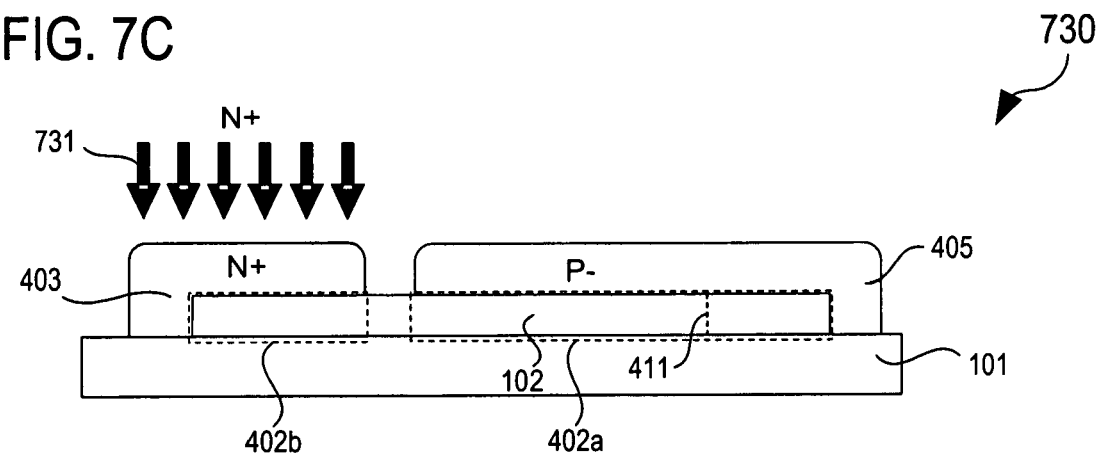

FIG. 7C shows in a cross-sectional view 730 that the first terminal region 403 may be heavily n-doped (n+ doped) by means of an n+ doping (indicated by arrows 731), for example, an n+ ion implantation (using e.g. the source/drain implants of a standard MOS process). In other words, the first terminal region 403 (collector terminal region) may be n+ counterdoped while the third terminal region 405 (base terminal region) may remain p– doped. In accordance with one embodiment, the counter doping of only the first terminal region 403 may be achieved using a suitable implantation mask during the ion implantation. In addition to the first terminal region 403, the second portion 402b of the body region 102 that is located below the first terminal region 403 may also be n+ doped during the n+ doping of the first terminal region 403, in accordance with an embodiment.

Figure 7D:
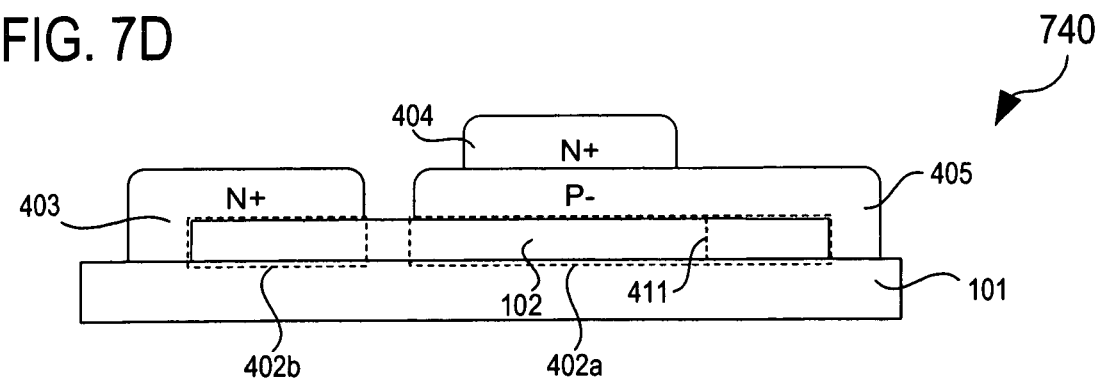

FIG. 7D shows in a cross-sectional view 740 that a second terminal region 404 may be formed over a portion of the third terminal region 405, wherein the second terminal region 404 may be configured as an emitter terminal region of the transistor. In accordance with an embodiment, the second terminal region 404 may be arranged above the n– doped portion of the body region 102 located to the left of line 411, as shown in FIG. 7D.

In accordance with the embodiment shown in FIG. 7D, the second terminal region 404 (emitter terminal region) may include polysilicon or may be made of polysilicon. The polysilicon emitter terminal region may be formed over the third terminal region 405 (base terminal region) using, for example, a suitable deposition method. As shown in FIG. 7D, the second terminal region 404 is n+ doped. The doping may be achieved by means of a suitable doping method, e.g. ion implantation or in-situ doping during deposition of the material (e.g. polysilicon) of the second terminal region 404.

In accordance with another embodiment, both the first terminal region 403 and the second terminal region 404 may initially be formed as undoped regions and may then be doped in the same doping process (e.g. using the same ion implantation process).

Figure 7E:
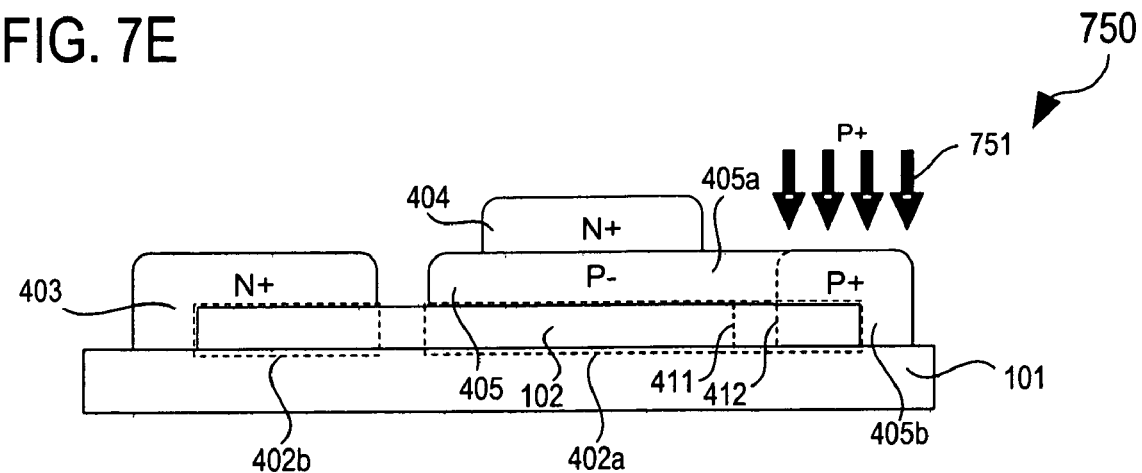

FIG. 7E shows in a cross-sectional view 750 that a second portion 405b of the third terminal region 405 may be heavily p-doped (p+ doped), e.g. by means of an ion implantation process, (indicated by arrows 751 in FIG. 7E), while a first portion 405a of the third terminal region 405 may remain lightly p-doped (p– doped). In addition to the second portion 405b of the third terminal region 405, the portion of the body region 102 located below the second portion 405b of the third terminal region 405 (that is, the portion of the body region 102 located to the right of line 412 in FIG. 7E) may also be doped during the p+ doping 751, as shown in FIG. 7E. In accordance with an embodiment, the doping of the second portion 405b of the third terminal region 405 and of the portion of the body region 102 located therebelow may be carried out using a suitable doping mask (e.g. photomask).

Figure 7F:
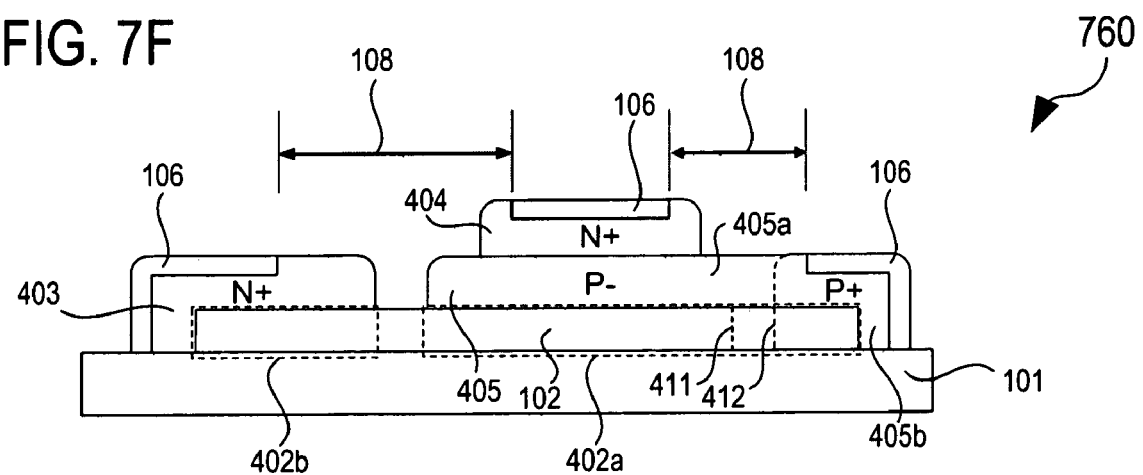

FIG. 7F shows in a cross-sectional view 760 that portions of the surface areas of the first, second and third terminal regions 403, 404, 405 may be silicided. In other words, a silicide layer 106 may be formed within surface portions of the terminal regions 403, 404, 405. In accordance with an embodiment, the silicidation may be blocked (for example, using a silicide blocking mask such as e.g. a photomask) across any pn-junctions in the device in order to prevent possible electrical shorts, as is shown in FIG. 7F, in which silicide-blocked areas are indicated by double arrows 108.

Figure 7G:
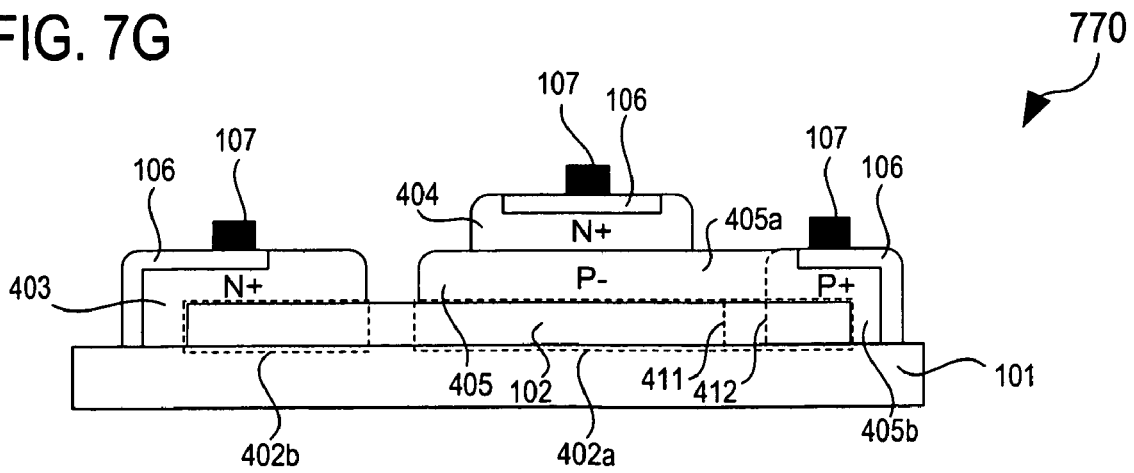

FIG. 7G shows in a cross-sectional view 770 that terminal contacts 107 may be formed on the silicided portions of the first, second and third terminal regions 403, 404, 405. The terminal contacts 107 may serve to make electrical contact to the terminal regions 403, 404, 405.

Clearly, by means of the method in accordance with the embodiment described above in connection with FIG. 7A to FIG. 7G, a vertical BJT device similar to the one shown in FIG. 4C may be formed in an SOI and/or FinFET process. The vertical BJT may include a SEG layer as bipolar base region and may use a polysilicon material as emitter. One effect of this embodiment is that only one SEG step may be used for the entire device. In accordance with an embodiment, this SEG may be in-situ doped (e.g. p-doped in case of an NPN device) and may serve as the base region. The same SEG may be used for the collector region where it may be n+ counterdoped using e.g. the source/drain implants of a standard MOS process.

Figure 8A:
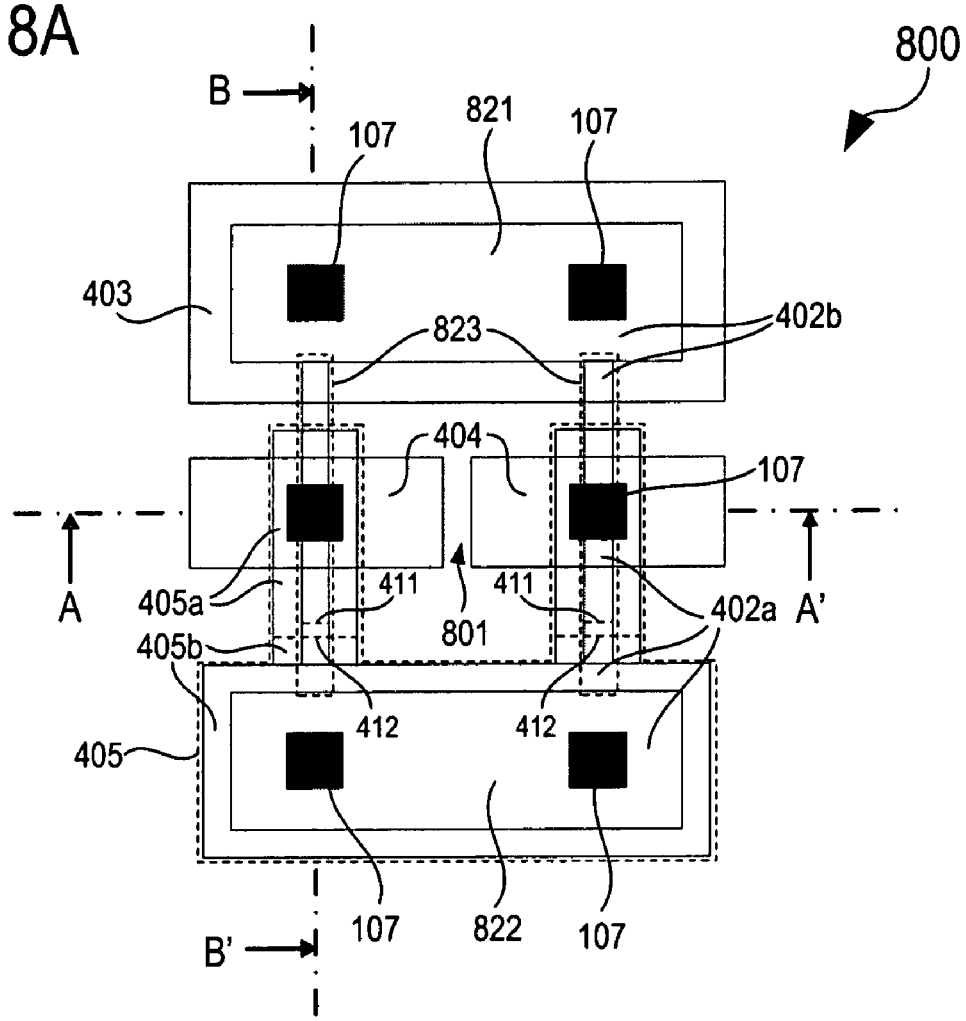
FIGS. 8A and 8B show a vertically integrated electronic device in accordance with another embodiment.
Figure 8B:
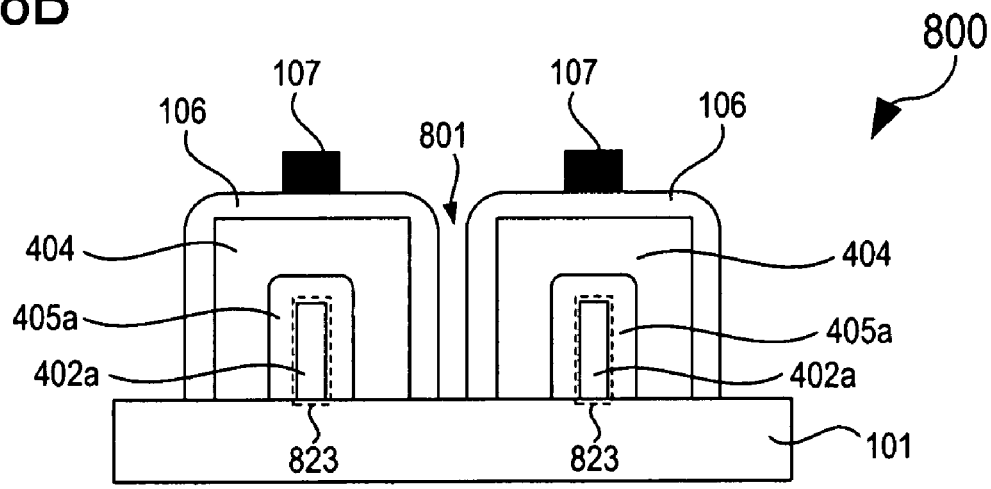

FIG. 8A and FIG. 8B show a vertically integrated electronic device 800 in accordance with another embodiment. The device 800 is configured as a bipolar junction transistor (BJT) device 800. FIG. 8A is a plan view of the bipolar transistor 800 and FIG. 8B is a cross-sectional view of the transistor 800 along the line A-A' in FIG. 8A.

The bipolar transistor 800 is configured as a fin-type NPN transistor based on a FinFET technology and having n+ doped first and second terminal regions 403, 404, and a third terminal region 405 including a p-doped first portion 405a and a p+ doped second portion 405b, wherein the first terminal region 403 is configured as a collector terminal region, the second terminal region 404 is configured as an emitter terminal region and the third terminal region 405 is configured as a base terminal region of the transistor 800, and wherein the first, second and third terminal regions 403, 403, 405 are in each case formed by means of an SEG process.

The transistor 800 has a multi-fin structure including a plurality of narrow fins (fin structures) 823 electrically connected in parallel and between a first contact region 821 and a second contact region 822 of the transistor 800. As an example, two fin structures 823 are shown in FIG. 8A. In accordance with other embodiments though, the transistor 800 may include only one fin structure 823 or more than two fin structures 823. The first and second contact regions 821, 822 are wider than the fin structures 823 and may, for example, serve as landing pads for terminal contacts 107 that may be formed on the contact regions 821, 822, as shown in FIG. 8A.

A cross-sectional view along line B-B' in FIG. 8A (i.e. along the longitudinal axis of one of the fin structures 823 in FIG. 8A) results in a similar layer structure as the one of the vertical bipolar transistor 400 shown in FIG. 4A, wherein the fin structure 823 and the first and second contact regions 821, 822 correspond to the body region 102 of the transistor 400 shown in FIG. 4A. In other words, the body region or body of the transistor 800 shown in FIG. 8A includes the narrow fin portions (fin structures 823) and the wider contact regions 821, 822.

Identical reference numerals are used in FIG. 8A/B and FIG. 4A to denote identical elements or regions in transistors 800 and 400. For the sake of brevity, these elements/regions or their doping will not be described again in detail, reference is made instead to the description of FIG. 4A.

It is shown that the third terminal region 405 (base terminal region) is grown over the sidewalls and top surfaces of each fin structure 823 and the second terminal region 404 (emitter terminal region) is grown on portions of the third terminal region 405 above and between the fin structures 823 in such a way that a gap 801 remains between two adjacent portions of the second terminal region 404, as shown in FIG. 8A and FIG. 8B. In accordance with an alternative embodiment, the gap 801 may be closed during formation of the second terminal region 404 by the respective SEG growth.

It is noted that the silicide 106 shown in the cross-sectional view of FIG. 8B is not shown in the plan view of FIG. 8A. In accordance with an alternative embodiment, the gap 801 may also be closed by the silicide 106 (cf. e.g. FIG. 9F and FIG. 10F).

One effect of the fin geometry is that the bipolar transistor 800 has a vertical and two lateral bipolar devices such that clearly a three-dimensional bipolar junction transistor (3D BJT) is provided. This can be seen, for example, from the cross-sectional view of FIG. 8B, in which it is shown that the third terminal region 405 (base terminal region), or more specifically, the p– doped first portion 405a of the third terminal region 405, is formed over the sidewalls and over the top surface of each fin structure 823 such that the first portion 405a of the third terminal region 405 clearly wraps the respective fin structure 823. The first portion 405a of the third terminal region 405 thus also has sidewalls which may be aligned approximately in parallel to the sidewalls of the fin structure 823, and a top surface which may be aligned approximately in parallel to the top surface of the fin structure 823. Furthermore it is shown, that the n+ doped second terminal region 404 (emitter terminal region) is formed over the sidewalls and over the top surface of the first portion 405a of the third terminal region 405 such that it wraps the first portion 405a of the third terminal region 405. Thus, two lateral junctions (one at each sidewall) and one vertical junction (at the top surface) are formed between the p– doped first portion 405a of the third terminal region 405 (base terminal region) and the n+ doped second terminal region 404 (emitter terminal region).

In accordance with one embodiment, the processing of the bipolar transistor 800 may include two in-situ doped SEG steps in order to form the first, second and third terminal regions 403, 404, 405 of the transistor 800 as described herein below.

In the following, a method for producing a vertically integrated electronic device such as, for example, the BJT device 800 shown in FIG. 8A and FIG. 8B in accordance with an embodiment will be described with reference to FIGS. 9A to 9G and FIGS. 10A to 10G, wherein FIGS. 9A to 9G show plan views of intermediate structures and FIGS. 10A to 10G are corresponding cross-sectional views of these structures. The method is to a great extent similar to the method described herein above in connection with FIGS. 5A to 5G, and reference is therefore also made to the description of FIGS. 5A to 5G for the sake of brevity.

Figure 9A:
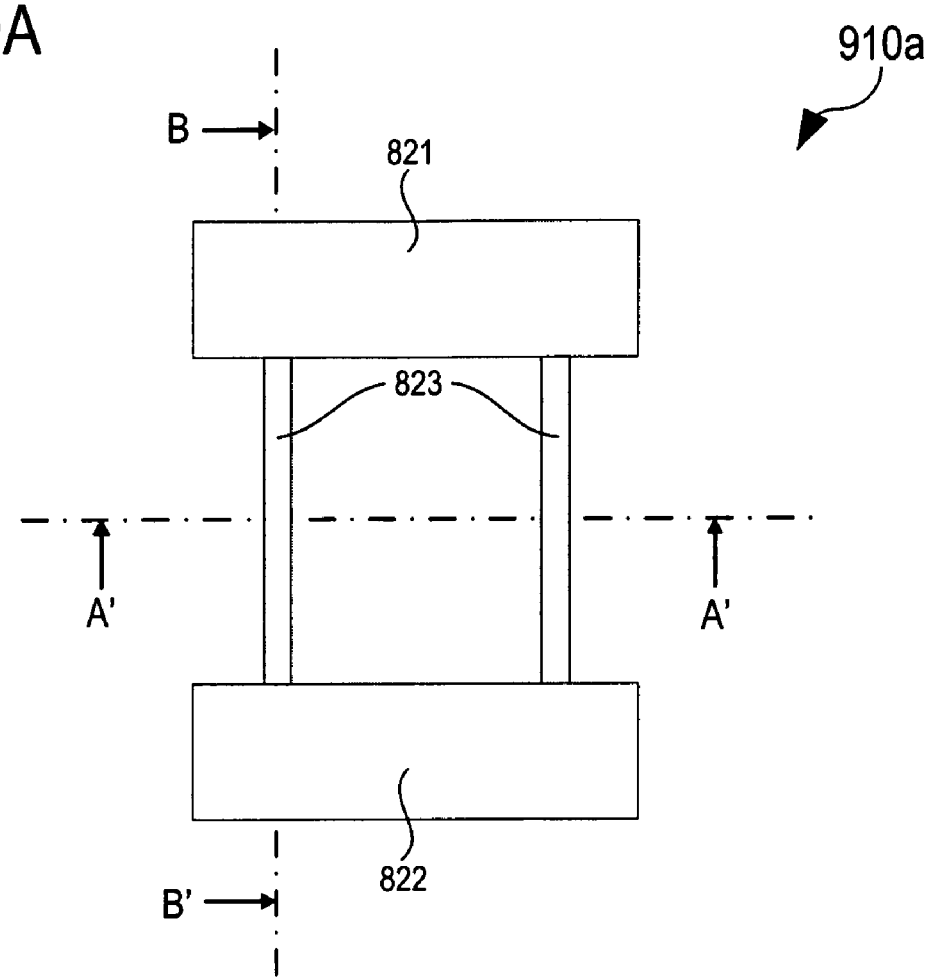
FIGS. 9A to 10G show a method for producing a vertically integrated electronic device in accordance with another embodiment.
Figure 10A:
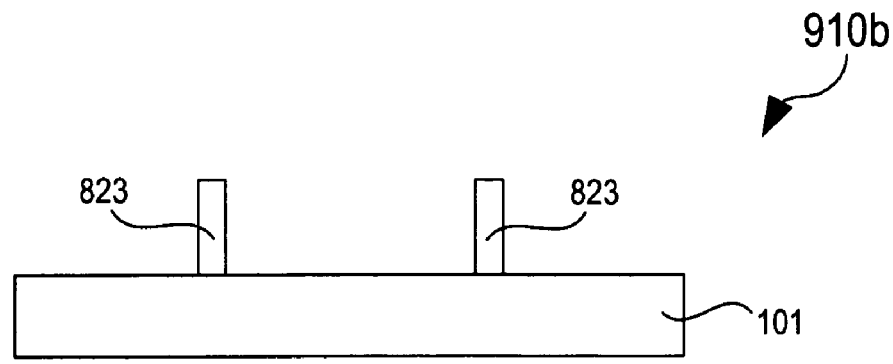

FIG. 9A and FIG. 10A show in a plan view 910a and in a cross-sectional view 910b along line A-A' that a shape of original seed silicon (intrinsic or lightly doped seed silicon) may be formed over a substrate 101. The shape may include a plurality of fin structures 823 (two fin structures 823 are shown, in accordance with other embodiments though, a different number of fin structures 823 may be formed) and first and second contact regions 821, 822, wherein the fin structures 823 may be electrically connected in parallel and between the first contact region 821 and the second contact region 822, as shown in FIG. 9A.

In accordance with an embodiment, the shape of seed silicon may be formed from a thin silicon top layer of an SOI substrate (using e.g. a suitable lithographic method) and may be arranged on a buried oxide (BOX) layer of the SOI substrate. In accordance with an alternative embodiment, a silicon bulk substrate may be used and the shape of seed silicon may be formed from a silicon layer near the surface of the silicon bulk substrate in this case. A cross-sectional view along line B-B' in FIG. 9A (that is, along the longitudinal axis of one of the fin structures 823) results in a structure that is similar to the structure shown in FIG. 5A, wherein the fin structure 823 and the first and second contact regions 821, 822 shown in FIG. 9A correspond to the body region 102 shown in FIG. 5A.

Figure 9B:
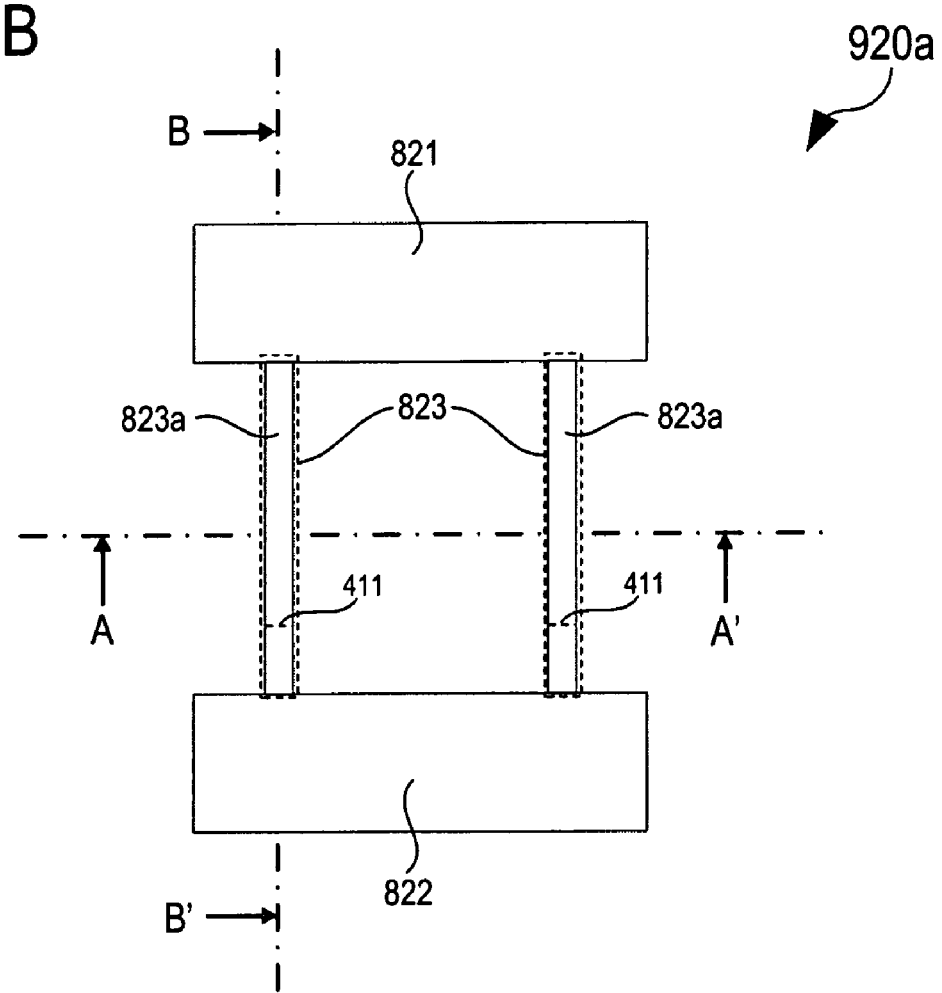
Figure 10B:
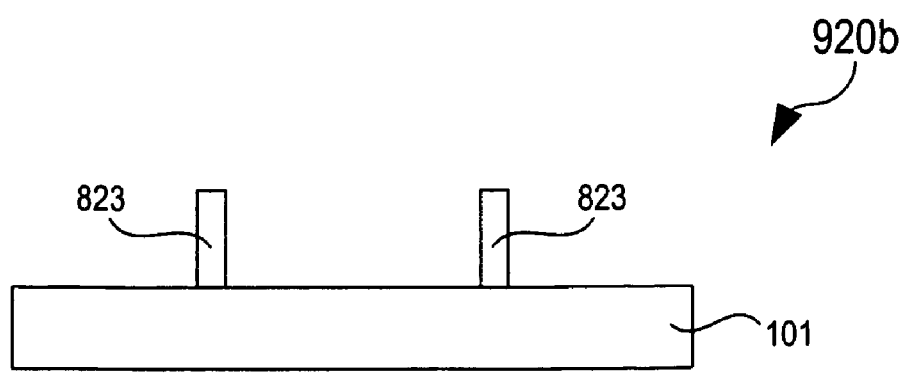

FIG. 9B and FIG. 10B show in a plan view 920a and in a cross-sectional view 920b along line A-A' that the first contact region 821 and a portion 823a of each fin structure 823 may be lightly n-doped (n− doped) by means of an ion implantation. Clearly, the portion 823a of the fin structures 823 located between the first contact region 821 and the line 411 may be doped. In accordance with an embodiment, the doping of the first contact region 821 and the portion 823a of the fin structures 823 may be carried out in a similar manner as described herein above in connection with FIG. 5B. Similarly as described above for FIG. 9A, a cross-sectional view along line B-B' in FIG. 9B results in a structure that is similar to the structure shown in FIG. 5B, wherein the fin structure 823 and the first and second contact regions 821, 822 shown in FIG. 9B correspond to the body region 102 shown in FIG. 5B.

Figure 9C:
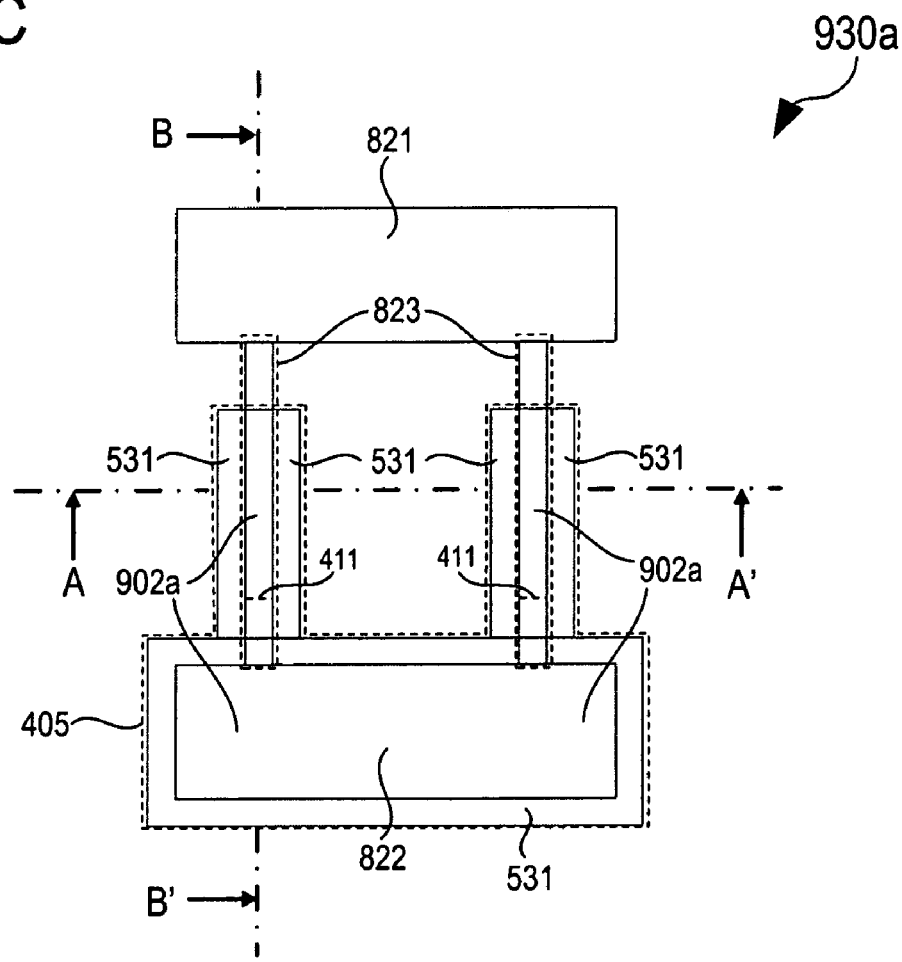
Figure 10C:
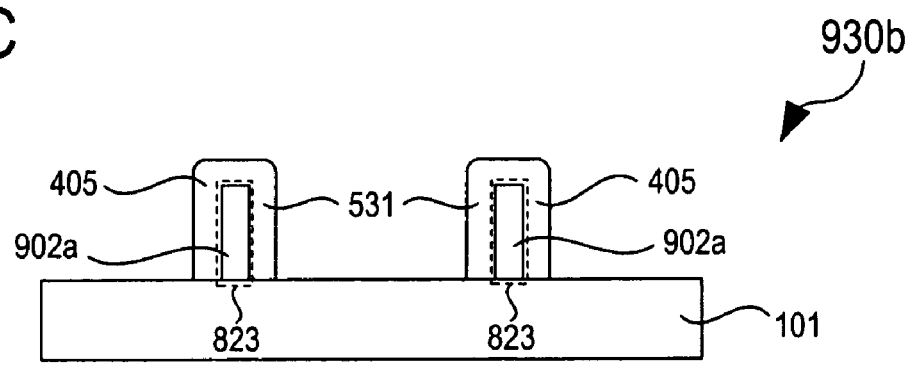

FIG. 9C and FIG. 10C show in a plan view 930a and in a cross-sectional view 930b along line A-A' that a first p-doped SEG layer 531 may be formed over portions of the fin structures 823 and over the second contact region 822. Clearly, the first SEG layer 531 may be formed over a region 902a that corresponds to the first portion 402a of the body region 102 shown in FIG. 5C. The first SEG layer 531 may be formed in a similar manner as described herein above in connection with FIG. 5C. For example, in accordance with an embodiment, the first SEG layer 531 may be in-situ doped. The first SEG layer 531 defines a third terminal region 405 of the transistor to be produced, wherein the third terminal region 405 may be configured as a base terminal region of the transistor.

In accordance with another embodiment, the first SEG layer 531 (third terminal region 405) may be deposited as a thin layer having, for example, a thickness in the range from about 5 nm to 20 nm, e.g. 10 nm in accordance with one embodiment. Thus, an efficient bipolar transistor with high current gain may be provided. Furthermore, a thin SEG layer may reduce the SEG processing time such that processing costs may be reduced.

Similarly as described above for FIG. 9A, a cross-sectional view along line B-B' in FIG. 9C results in a structure that is similar to the structure shown in FIG. 5C, wherein the fin structure 823 and the first and second contact regions 821, 822 shown in FIG. 9C correspond to the body region 102 shown in FIG. 5C.

Figure 9D:
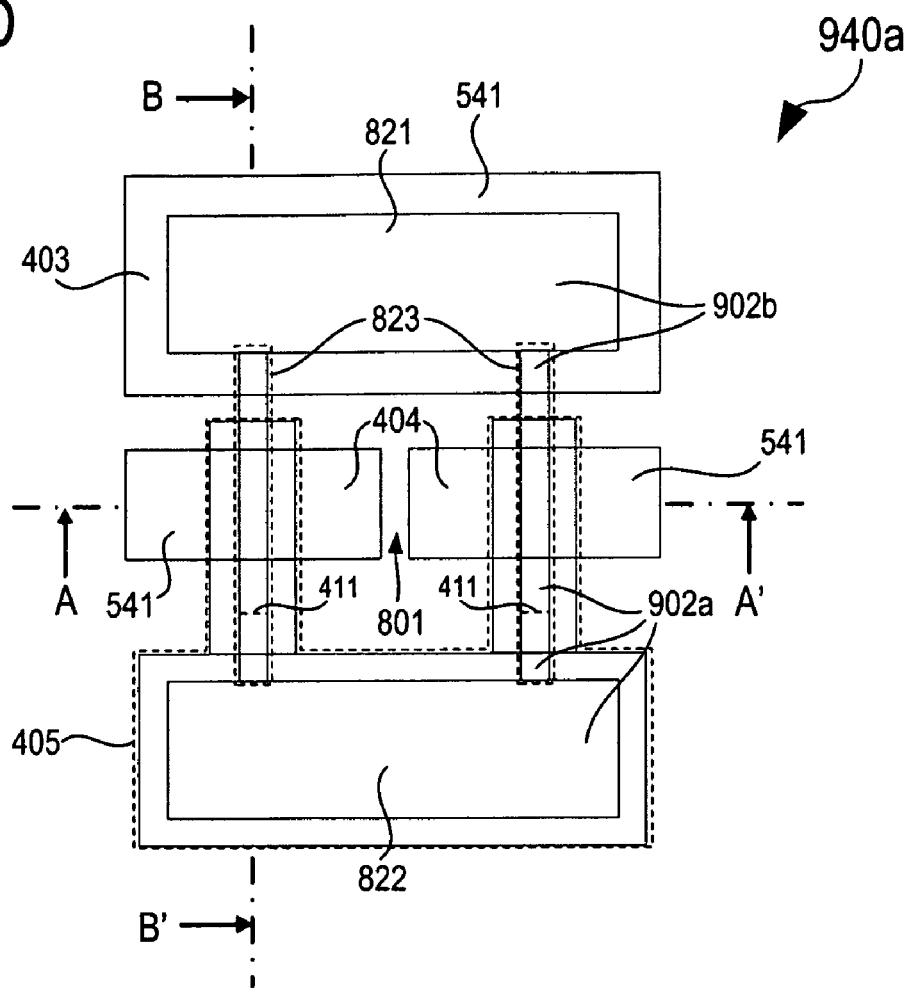
Figure 10D:
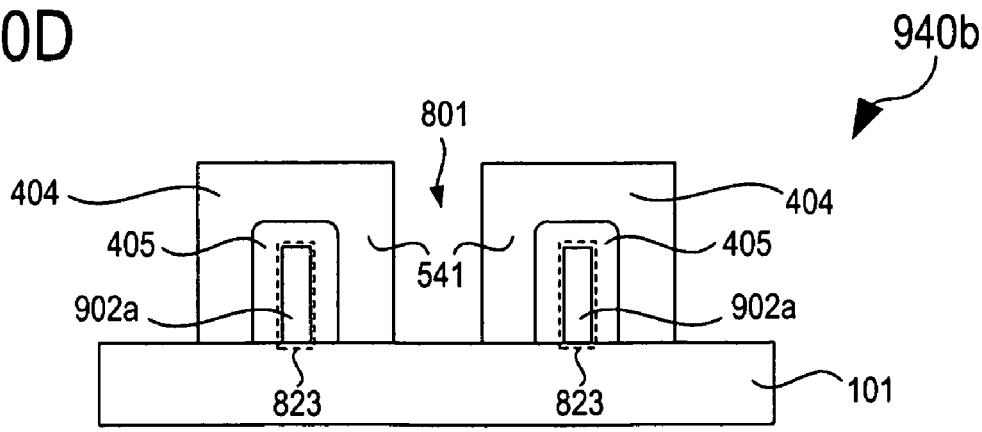

FIG. 9D and FIG. 10D show in a plan view 940a and in a cross-sectional view 940b along line A-A' that a second n+ doped SEG layer 541 may be formed over the contact region 821 and over a portion of the fin structure 823 adjacent to the first contact region 821. Clearly, the second SEG layer 541 may be formed over a region 902b that corresponds to the second portion 402b of the body region 102 shown in FIG. 5D. Furthermore, the second SEG layer 541 may be formed over portions of the third terminal region 405 above the fin structures 823. The second SEG layer 541 may be formed in a similar manner as described herein above in connection with FIG. 5D. For example, in accordance with an embodiment, the second SEG layer 541 may be in-situ doped.

The part of the second SEG layer 541 that is formed over the region 902b (i.e. over the fin structures 823 and over the first contact region 821) defines a first terminal region 403, and the part of the second SEG layer 541 that is formed over the third terminal region 405 above the fin structures 823 defines a second terminal region 404 of the bipolar transistor to be produced, wherein the first terminal region 403 may be configured as a collector terminal region and the second terminal region 404 may be configured as an emitter terminal region 404 of the transistor. In accordance with an embodiment, the second SEG layer 541 may be formed such that a gap 801 remains between adjacent portions of the third terminal region 405, as shown in FIG. 9D. In accordance with an alternative embodiment, the gap 801 may be closed by the second SEG layer 541. Similarly as described above for FIG. 9A, a cross-sectional view along line B-B' in FIG. 9D results in a structure that is similar to the structure shown in FIG. 5D, wherein the fin structure 823 and the first and second contact regions 821, 822 shown in FIG. 9D correspond to the body region 102 shown in FIG. 5D.

Figure 9E:
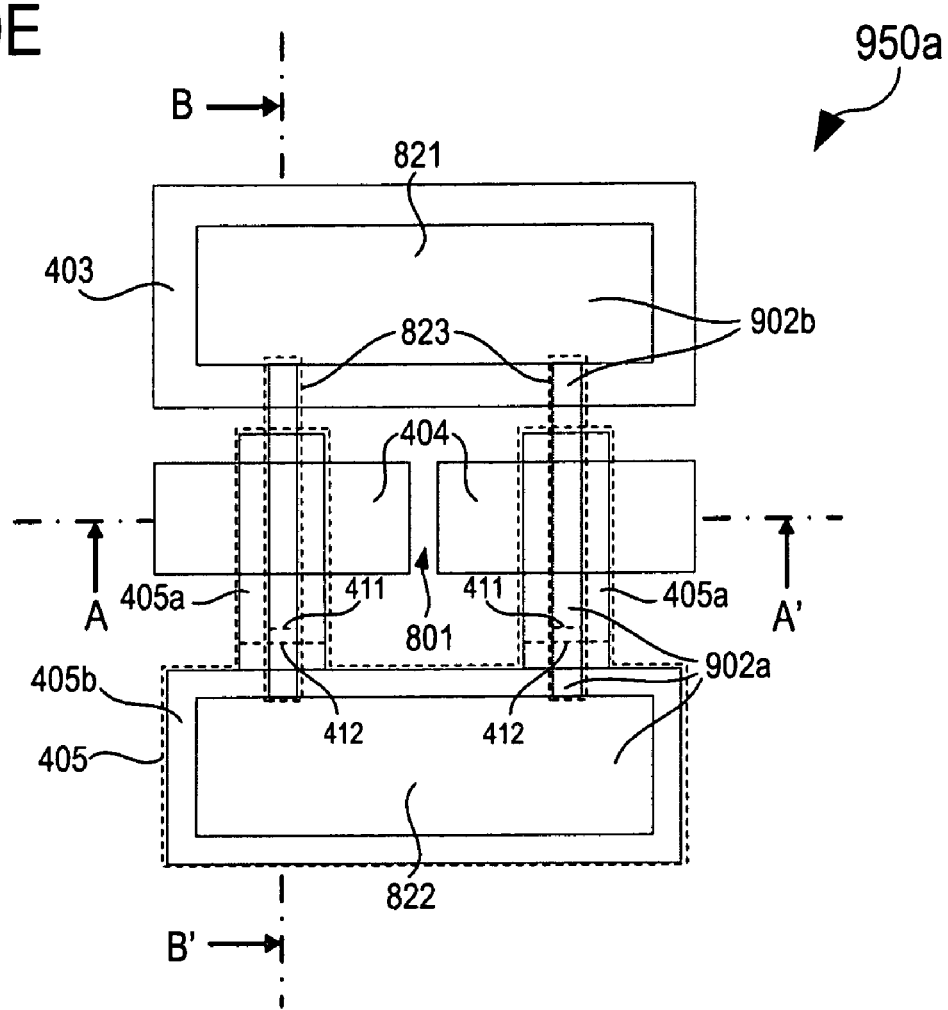
Figure 10E:
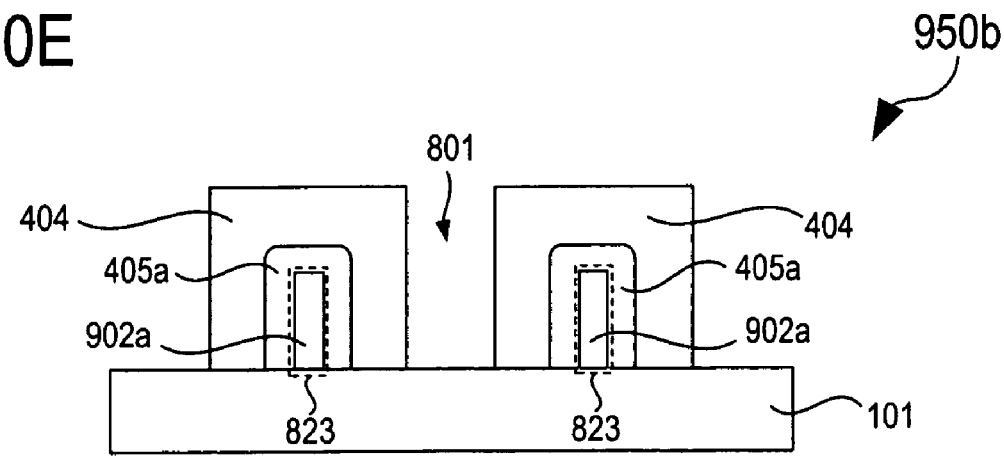

FIG. 9E and FIG. 10E show in a plan view 950a and in a cross-sectional view 950b along line A-A' that a second portion 405b of the third terminal region 405 may be heavily p–doped (p+ doped), e.g. by means of an ion implantation process (p+ implant), while a first portion 405a of the third terminal region 405 remains lightly p-doped (p− doped). The first and second portions 405a, 405b of the third terminal region 405 are delimited by line 412 in FIG. 9E. In addition to the second portion 405b of the third terminal region 405, portions of the fin structures 823 and of the second contact region 822 located below the second portion 405b of the third terminal region 405 may also be doped during the p+ doping, in accordance with an embodiment. For example, the portion of each of the fin structures 823 located between line 412 and the second contact region 822 may be p+ doped during the p+ doping. In accordance with an embodiment, the p+ doping may be carried out in a similar manner as described herein above in connection with FIG. 5E. Similarly as described above for FIG. 9A, a cross-sectional view along line B-B' in FIG. 9E results in a structure that is similar to the structure shown in FIG. 5E, wherein the fin structure 823 and the first and second contact regions 821, 822 shown in FIG. 9E correspond to the body region 102 shown in FIG. 5E.

Figure 9F:
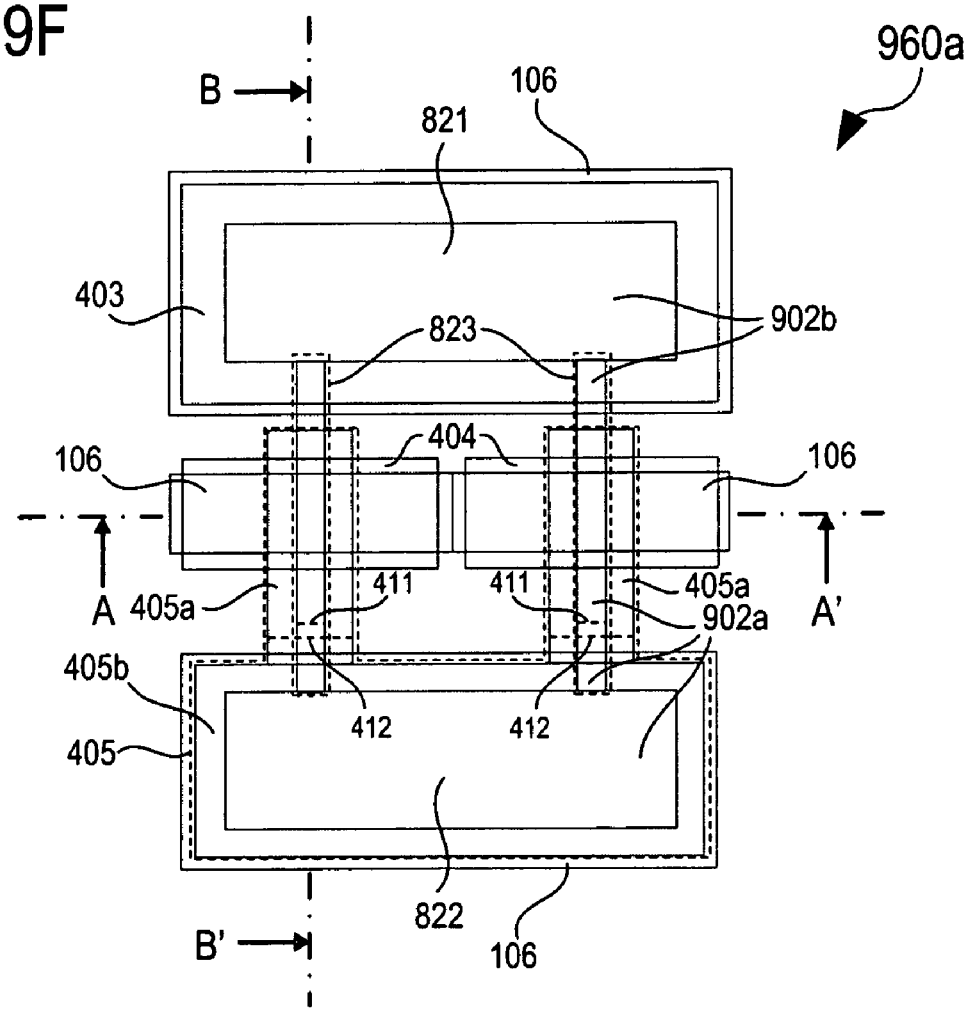
Figure 10F:
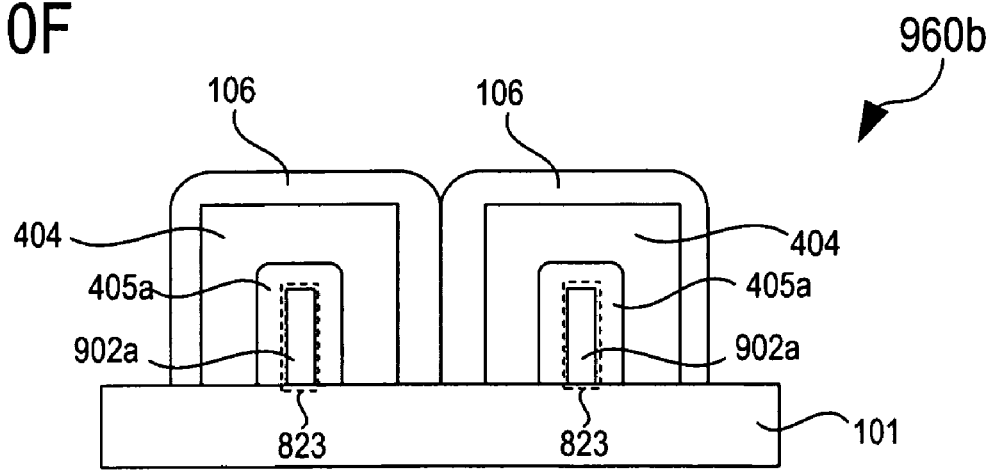

FIG. 9F and FIG. 10F show in a plan view 960a and in a cross-sectional view 960b along line A-A' that the first, second and third terminal regions 403, 404, 405 may be partially silicided. In other words, a silicide layer 106 is formed within portions of the surface areas of the terminal regions 403, 404, 405. In accordance with an embodiment, the silicidation may be blocked (for example, using a silicide blocking mask such as e.g. a photomask) across any pn-junctions in the device in order to prevent possible electrical shorts, as is shown in FIG. 9F. In accordance with an embodiment, the gap 801 between the adjacent portions of the second terminal region 404 may be closed by the silicide 106, as shown in FIG. 10F. In accordance with an alternative embodiment, the silicide layer 106 may be formed with such a thickness that the gap 801 remains open (cf. FIG. 8B). Similarly as described above for FIG. 9A, a cross-sectional view along line B-B' in FIG. 9F results in a structure that is similar to the structure shown in FIG. 5F, wherein the fin structure 823 and the first and second contact regions 821, 822 shown in FIG. 9F correspond to the body region 102 shown in FIG. 5F.

Figure 9G:
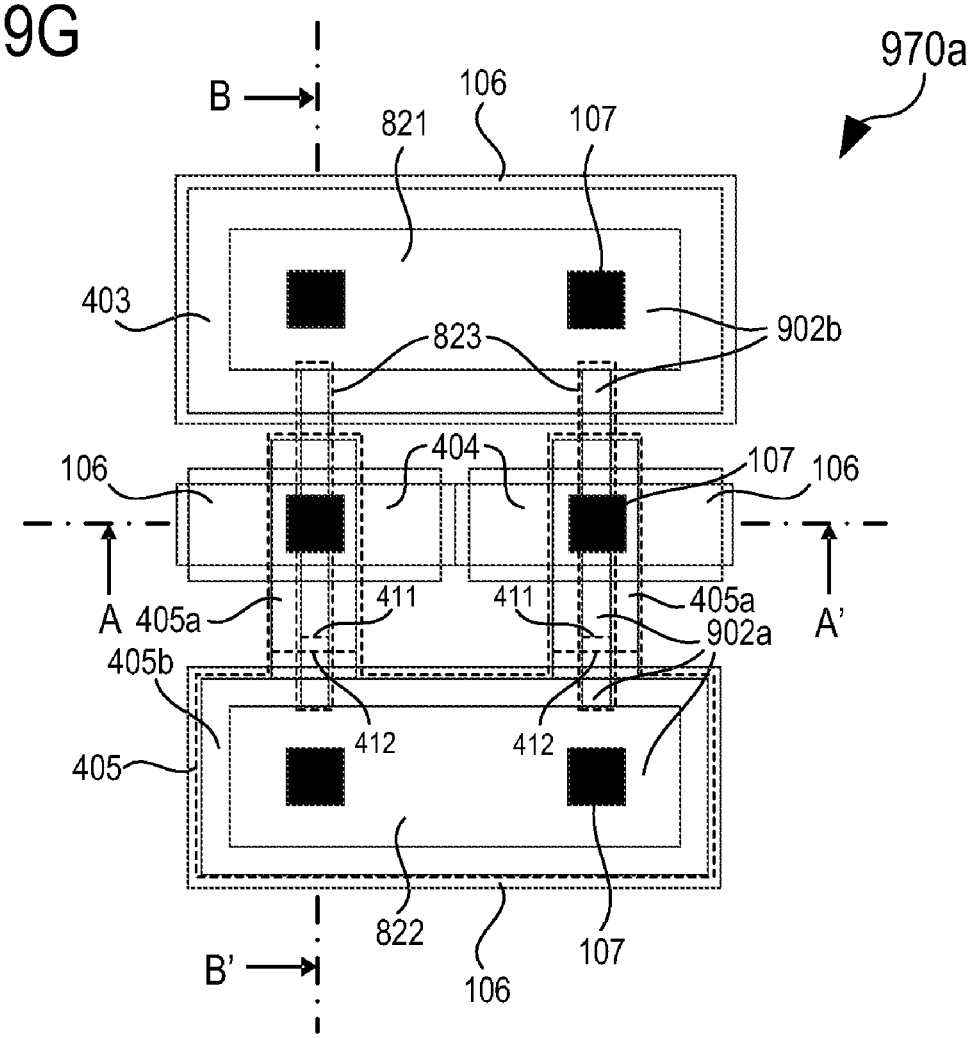
Figure 10G:
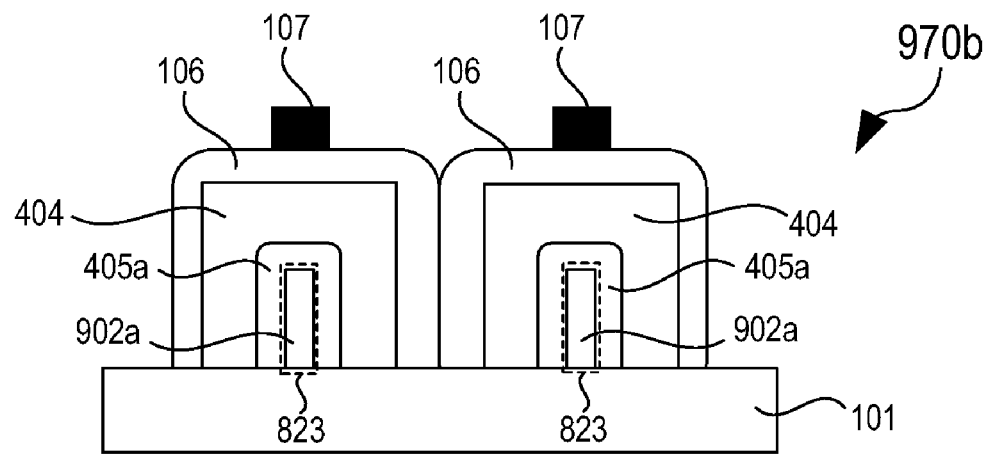

FIG. 9G and FIG. 10G show in a plan view 970a and in a cross-sectional view 970b along line A-A' that terminal contacts 107 may be formed on the silicided surface portions of the first, second and third terminal regions 403, 404, 405. The terminal contacts 107 may serve to make electrical contact to the terminal regions 403, 404, 405. Clearly, the terminal contacts 107 may provide a collector contact, an emitter contact and a base contact of the transistor. Similarly as described above for FIG. 9A, a cross-sectional view along line B-B' in FIG. 9G results in a structure that is similar to the structure shown in FIG. 5G, wherein the fin structure 823 and the first and second contact regions 821, 822 shown in FIG. 9G correspond to the body region 102 shown in FIG. 5G.

Clearly, by means of the method in accordance with the embodiment described above in connection with FIGS. 9A to 9G and FIGS. 10A to 10G, a BJT device similar to the transistor 800 shown in FIGS. 8A and 8B may be provided in a FinFET technology.

In accordance with another embodiment, a fin-type BJT device having a similar cross-sectional structure as the transistor 450 shown in FIG. 4B may be formed in a similar manner, wherein the first terminal region 403 (collector terminal region) may be formed such that it adjoins or partially overlaps the third terminal region 405 (base terminal region).

In accordance with still another embodiment, a fin-type BJT device having a similar cross-sectional structure as the transistor 470 shown in FIG. 4C may be formed in a similar manner as described above in connection with FIG. 7A to FIG. 7G.

Figure 11:
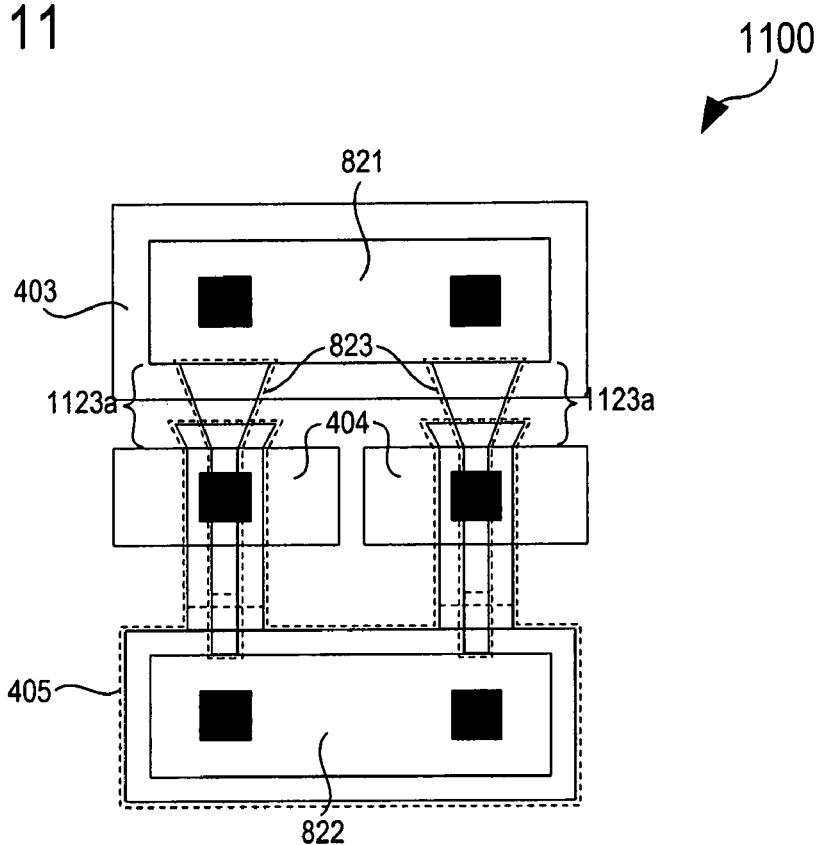
FIG. 11 shows a vertically integrated electronic device in accordance with another embodiment.

FIG. 11 shows a vertically integrated electronic device 1100 in accordance with another embodiment. The device 1100 is configured as a vertical BJT device with a fin geometry and is different from the BJT device 800 shown in FIGS. 8A and 8B in that in a region 1123a of each fin structure 823 that is arranged at least partially between the third terminal region 405 (base terminal region) and the first terminal region 403 (collector terminal region), the cross-sectional area of the fin structure 823 increases in the direction from the third terminal region 405 towards the first terminal region 403. In other words, the link region from the collector contact region into the fin-type active bipolar transistor may be widened up, for example in a V-shape in accordance with an embodiment as shown in FIG. 11 (other shapes may be possible in accordance with other embodiments), to provide a larger cross-section for the collector current and a lower series resistance. One effect of the transistor 1100 shown in FIG. 11 may thus be seen in that a transistor with an improved (i.e. reduced) collector series resistance may be provided.

In accordance with an embodiment, the bipolar transistor 1100 may be fabricated in a similar manner as described above in connection with FIGS. 9A to 10G, wherein however the seed silicon shape shown in FIG. 9A may be formed such that the fin structures 823 have an increasing cross-sectional area towards the first contact region 821 (i.e. towards the collector contact region) as shown in FIG. 11.

Figure 12:
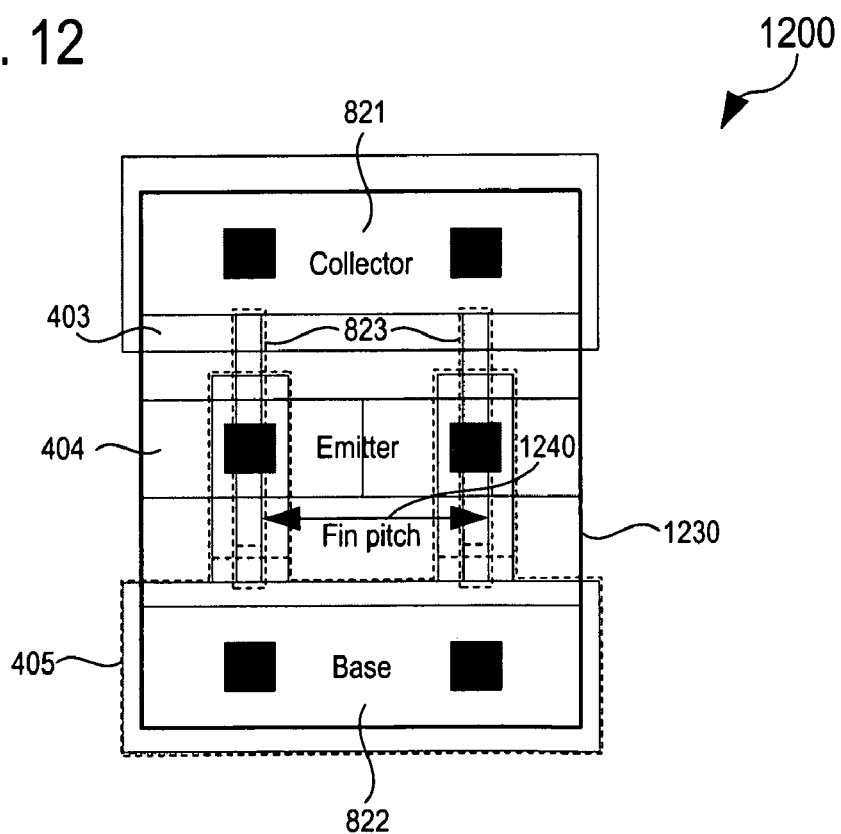
FIG. 12 shows a layout arrangement of a bipolar transistor device in accordance with another embodiment.

FIG. 12 shows a layout arrangement of a fin-type bipolar transistor device 1200 in a so-called unit cell in accordance with another embodiment. The cell boundary (drawn layout) of the unit cell is indicated by rectangle 1230 in FIG. 12. The transistor device 1200 may be configured in accordance with one of the embodiments described herein. For circuit design, the device allows for the creation of a unit cell 1230, which may be well-suited for best model-hardware-correlation. In accordance with one embodiment, the unit cell 1230 may include two fin structures (or fins) 823, as shown in FIG. 12. In accordance with other embodiments, the unit cell 1230 may include only one or any other number of fins 823. The fin pitch (in other words, the distance between two neighboring fin structures 823, as denoted by double arrow 1240 in FIG. 12) within the unit cell 1230 may, for example, be determined by lithography constraints in the process.

Figure 13:
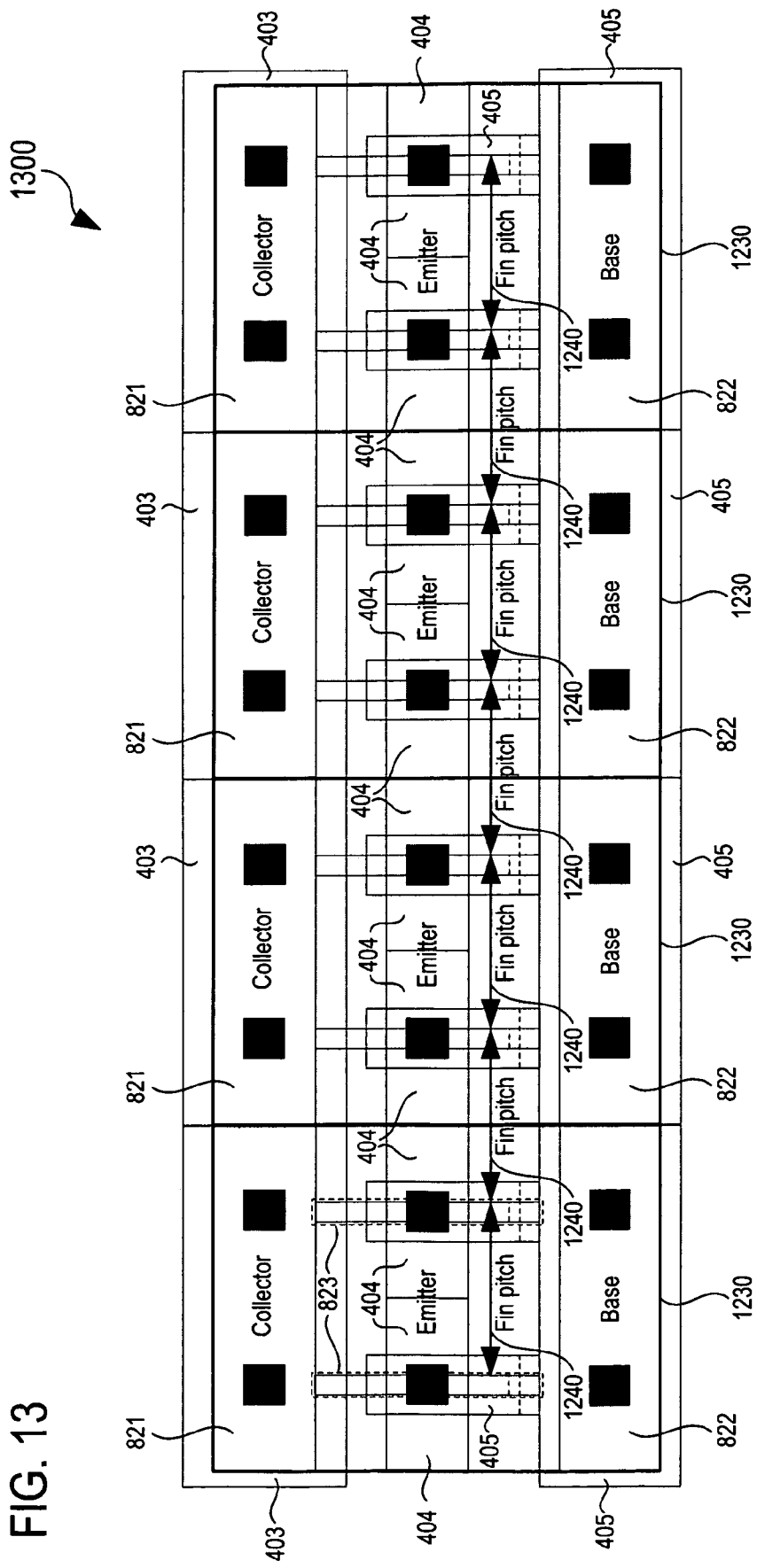
FIG. 13 shows a bipolar transistor arrangement in accordance with another embodiment.

In accordance with one embodiment, a constant fin pitch may be used. In other words, the same fin pitch may be repeated across multiple cells 1230 in an array of unit cells 1230 as is shown in FIG. 13, which shows a transistor arrangement 1300 in accordance with an embodiment having four unit cells 1230 arranged adjacent to one another in a row. In accordance with other embodiments, a different number of unit cells 1230 may be used.

Each unit cell 1230 of the array includes two fins 823, wherein the fin pitch 1240 is the same throughout the whole array. In other words, the fin pitch between the two fins 823 within one unit cell 1230 is the same as the fin pitch between two neighboring fins 823 of two adjacent unit cells 1230. One effect of using the same fin pitch throughout an array of cells 1230 may be that the processing reproducibility may be improved or optimized. In accordance with another embodiment, the fin pitch between two neighboring fins 823 of two adjacent unit cells 1230 may be different from the fin pitch between two fins 823 within one unit cell 1230.

In accordance with another embodiment, other unit cells that may include only one or any other number of fins may be used in the transistor arrangement 1300, and may be repeated, for example, until a desired current strength is obtained.

Figure 14:
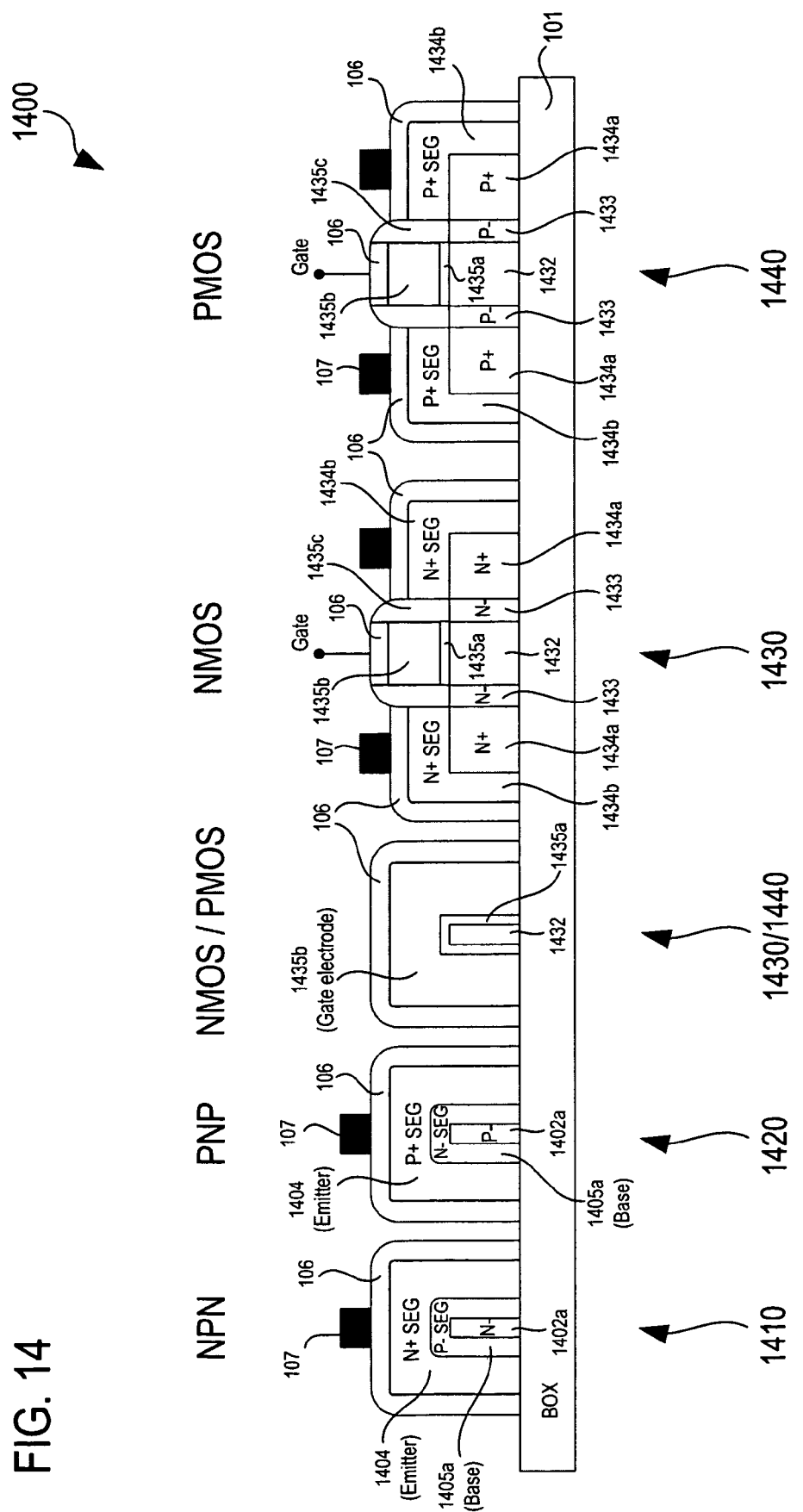
FIG. 14 shows a BiCMOS transistor arrangement in accordance with another embodiment.

FIG. 14 shows a BiCMOS transistor arrangement 1400 in accordance with another embodiment. The transistor arrangement 1400 may include one or more bipolar transistor devices (NPN and/or PNP devices) and one or more MOS transistor devices (NMOS and/or PMOS devices).

As an example, one NPN device 1410 and one PNP device 1420 are shown (as transversal cross-sections through the emitter and base regions), and one NMOS device 1430 and one PMOS device 1440 are shown (as longitudinal cross-sections and as transversal cross-section through the gate region) in FIG. 14.

The devices 1410, 1420, 1430 and 1440 may be formed on or above a common substrate 101. In accordance with an embodiment, the substrate 101 may be configured as a silicon-on-insulator (SOI) substrate, and the devices 1410, 1420, 1430, 1440 may be formed on an insulating layer (e.g. buried oxide (BOX) layer) of the SOI substrate. In accordance with an alternative embodiment, the substrate 101 may be configured as a standard bulk substrate.

The NPN and/or PNP devices may be configured in accordance with one of the embodiments described herein.

For example, in accordance with one embodiment, the NPN device 1410 may include a lightly n-doped (n− doped) seed silicon region 1402a arranged on the substrate 101, a lightly p-doped (p− doped) base terminal region 1405a formed on the seed silicon region 1402a by means of an SEG process, and a heavily n-doped (n+ doped) emitter terminal region 1404 formed on the base terminal region 1405a by means of an SEG process, as shown in FIG. 14. A surface portion of the emitter terminal region 1404 may be silicided (indicated by silicide layer 106), and one or more contacts 107 may be formed on the emitter terminal region 1404, e.g. on the silicided portion thereof, as shown. The NPN device 1410 may further be configured in accordance with one of the embodiments described herein above. In particular, the NPN device 1410 may include an n-doped (e.g. n+ doped in accordance with an embodiment) collector terminal region that may be formed on the n− doped seed silicon region 1402a (not shown, see e.g. FIG. 4A).

The PNP device 1420 may be configured in a similar manner as the NPN device 1410, wherein the doping types of the doped regions (doped seed silicon region 1402a, base terminal region 1405a, emitter terminal region 1404, collector terminal region) may be reversed, as shown in FIG. 14.

The NMOS device 1430 may include a shape of seed silicon 1432 that may have any doping (e.g. n-doped, p-doped or intrinsic silicon). The NMOS device 1430 may further include source/drain (S/D) extensions 1433 formed within the seed silicon shape. In accordance with an embodiment, the S/D extensions 1433 may be lightly n-doped (e.g. n− doped), as shown in FIG. 14. The NMOS device 1430 may further include highly n-doped (n+ doped) source/drain regions 1434a formed within the seed silicon shape and adjacent to the source/drain extensions 1433. The NMOS device 1430 may further include highly n-doped (n+ doped) source/drain SEG regions 1434b formed on the n+ doped source/drain regions 1434a. Portions of the source/drain SEG regions 1434b may be silicided (indicated by silicide layer 106), and one or more contacts 107 may be formed on the source/drain SEG regions 1434b, e.g. on the silicided portions thereof in accordance with an embodiment, as shown in FIG. 14 The NMOS device 1430 may further include a gate region including a gate dielectric 1435a and a gate electrode 1435b (e.g. a polysilicon gate) formed on the gate dielectric 1435a, wherein the gate region may be formed on the seed silicon shape 1432 between the source/drain SEG regions 1434b and may be separated from the source/drain SEG regions 1434b by gate spacers 1435c. In accordance with an embodiment, the gate electrode or gate 1435b may be silicided, as shown in FIG. 14.

The PMOS device 1440 may be configured in a similar manner as the NMOS device 1430, wherein the doping types of the doped regions (source/drain regions 1434a, source/drain SEG regions 1434b, source/drain extensions 1433) may be reversed.

FIG. 14 clearly shows a schematic representation of a process integration for a FinFET BiCMOS process in accordance with an embodiment. In accordance with this embodiment, NPN and PNP bipolar junction transistors 1410, 1420 may be integrated together with NMOS and PMOS field-effect transistors 1430, 1440 on a common substrate 101.

Each of the devices 1410, 1420, 1430, 1440 may be configured as either a fin-type or as a planar-type device depending, for example, on the needs of the integrated circuit design. The processing may consist of up to four in-situ doped SEG steps to provide the thin SEG layers for both the NPN and PNP base regions 1405a. The thin SEG layers may, for example, be formed in accordance with one of the embodiments described herein. In accordance with one embodiment, the thicker emitter SEG regions 1404 may be processed at the same time as the source/drain SEG regions 1434b of the NMOS and PMOS devices 1430, 1440.

Figure 15:
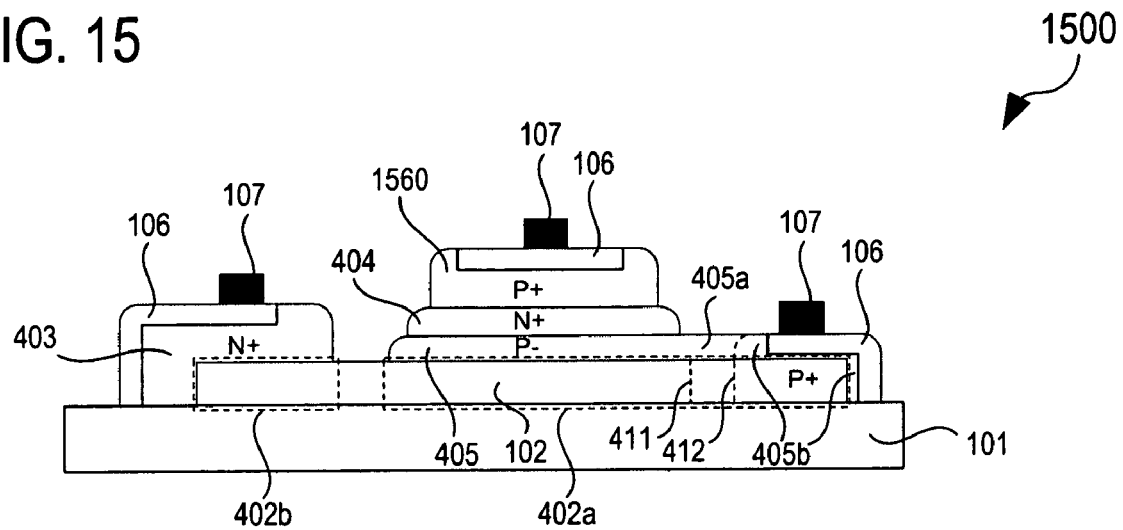
FIG. 15 shows a vertically integrated electronic device in accordance with another embodiment.

FIG. 15 shows a vertically integrated electronic device 1500 in accordance with another embodiment.

The electronic device 1500 is different from the device 400 shown in FIG. 4A in that it includes a fourth terminal region 1560 arranged on a portion of the second terminal region 404.

In accordance with an embodiment, the fourth terminal region 1560 may be p-doped, for example heavily p-doped (e.g. p+ doped), as shown, such that a pn-junction may be formed between the second terminal region 404 and the fourth terminal region 1560.

In accordance with another embodiment, the fourth terminal region 1560 may be formed by means of a selective epitaxial growth (SEG) process in a similar manner as described herein in accordance with other embodiments. That is, in accordance with an embodiment, the fourth terminal region 1560 may be formed by growing an epitaxial layer (e.g. an epitaxial silicon layer) selectively on at least a portion of the second terminal region 404. In accordance with an embodiment, the epitaxial layer may be in-situ doped. In accordance with an alternative embodiment, the epitaxial layer may be doped after the growth process, e.g. by means of an ion implantation process.

In accordance with an embodiment, the fourth terminal region 1560 may be silicided, as shown in FIG. 15. In accordance with one embodiment, the silicidation of the fourth terminal region 1560 may be carried out simultaneously with a silicidation of the first and third terminal regions 403, 405, for example using a suitable silicide blocking mask to block silicidation across any pn-junctions in the device 1500.

Clearly, the electronic device 1500 is configured as a thyristor (for example, as a silicon controlled rectifier (SCR) in accordance with one embodiment) having a vertical npnp layer stack formed by the n− doped part of the body region 102, the p− doped first portion 405a of the third terminal region 405, the n+ doped second terminal region 404 (in accordance with other embodiments, the second terminal region 404 may be n− or n doped, in general may have any type of n-doping), and the p+ doped fourth terminal region 1560. The first terminal region 403 may be configured as a cathode terminal region, the third terminal region 405 may be configured as a gate terminal region, and the fourth terminal region 1560 may be configured as an anode terminal region of the thyristor, wherein terminal contacts 107 may be formed on the first, third and fourth terminal regions 403, 405, 1560, e.g. on silicided portions thereof in accordance with an embodiment, as shown in FIG. 15.

Clearly, FIG. 15 shows a thyristor device that may be obtained by stacking SEG regions to a vertical npnp layer stack.

Figure 16:
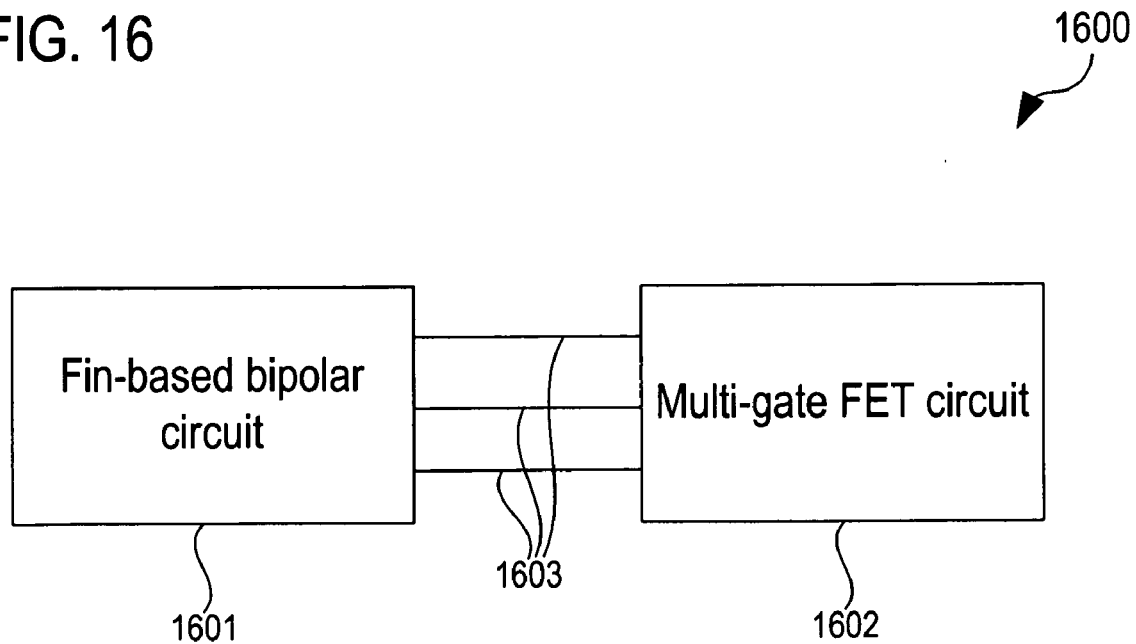
FIG. 16 shows a BiCMOS circuit arrangement in accordance with another embodiment.

FIG. 16 shows a BiCMOS circuit arrangement 1600 in accordance with another embodiment. The circuit arrangement 1600 includes a first sub-circuit 1601 and a second sub-circuit 1602. The first sub-circuit 1601 is configured as a fin-based bipolar sub-circuit while the second sub-circuit 1602 is configured as a MuGFET/FinFET sub-circuit. In other words, the first sub-circuit 1601 may include one or more bipolar devices with a fin structure, and the second sub-circuit 1602 may include one or more MOS devices with a fin structure. In accordance with an embodiment, the first sub-circuit 1601 may be composed of one or more bipolar devices (including, for example, bipolar transistors) to form a specific electrical functionality while the second sub-circuit 1602 may include one or more FinFET/MuGFET ("MOS") devices.

The bipolar devices of the bipolar sub-circuit 1601 may include one or more SEG bipolar devices (i.e., bipolar devices including one or more terminal layers grown by selective epitaxial growth) in accordance with one of the embodiments described herein. For example, in accordance with one embodiment, at least one of the bipolar devices may be configured as an SEG BJT device, i.e. as a bipolar junction transistor device including one or more terminal layers grown by selective epitaxial growth, as described herein. The SEG BJT device may be configured as a lateral SEG BJT device or as a vertical SEG BJT device in accordance with one of the embodiments described herein. In accordance with another embodiment, at least one of the bipolar devices may be configured as an SEG thyristor (e.g. as an SCR), for example in a similar manner as described herein in connection with FIG. 15.

In accordance with one embodiment, the FinFET/MuGFET devices of the FinFET/MuGFET sub-circuit 1602 may, for example, be configured in a similar manner as the MOS devices 1430, 1440 shown in FIG. 14.

FIG. 16 clearly is a general schematic illustration of combining bipolar devices (including, for example, bipolar transistors) and FinFET/MuGFET devices to use them in their corresponding sub-circuits 1601, 1602. According to the illustrated general scheme, one or more inputs and outputs of both sub-circuits 1601, 1602 may be connected to one another, as represented by lines 1603 in FIG. 16. For example, in accordance with an embodiment, at least one of the source, drain and gate terminals of a FinFET/MuGFET device of the FinFET/MuGFET sub-circuit 1602 may be connected to at least one of the emitter, base and collector terminals of a bipolar transistor device in the bipolar sub-circuit 1601.

The BiCMOS circuit arrangement shown in FIG. 16 includes MOS and bipolar devices (e.g. BJT devices). In accordance with an embodiment, the bipolar devices may include one or more BJT devices that are configured for large drive currents, such as for driving large loads, including but not limited to ESD protection devices. One effect of such BJT devices may be that they may withstand higher switching voltages than MuGFET MOS devices. This may, for example, be used, in interfaces between MOS circuits and high-voltage domains, e.g. in "direct-to-battery" connections.

Figure 17:
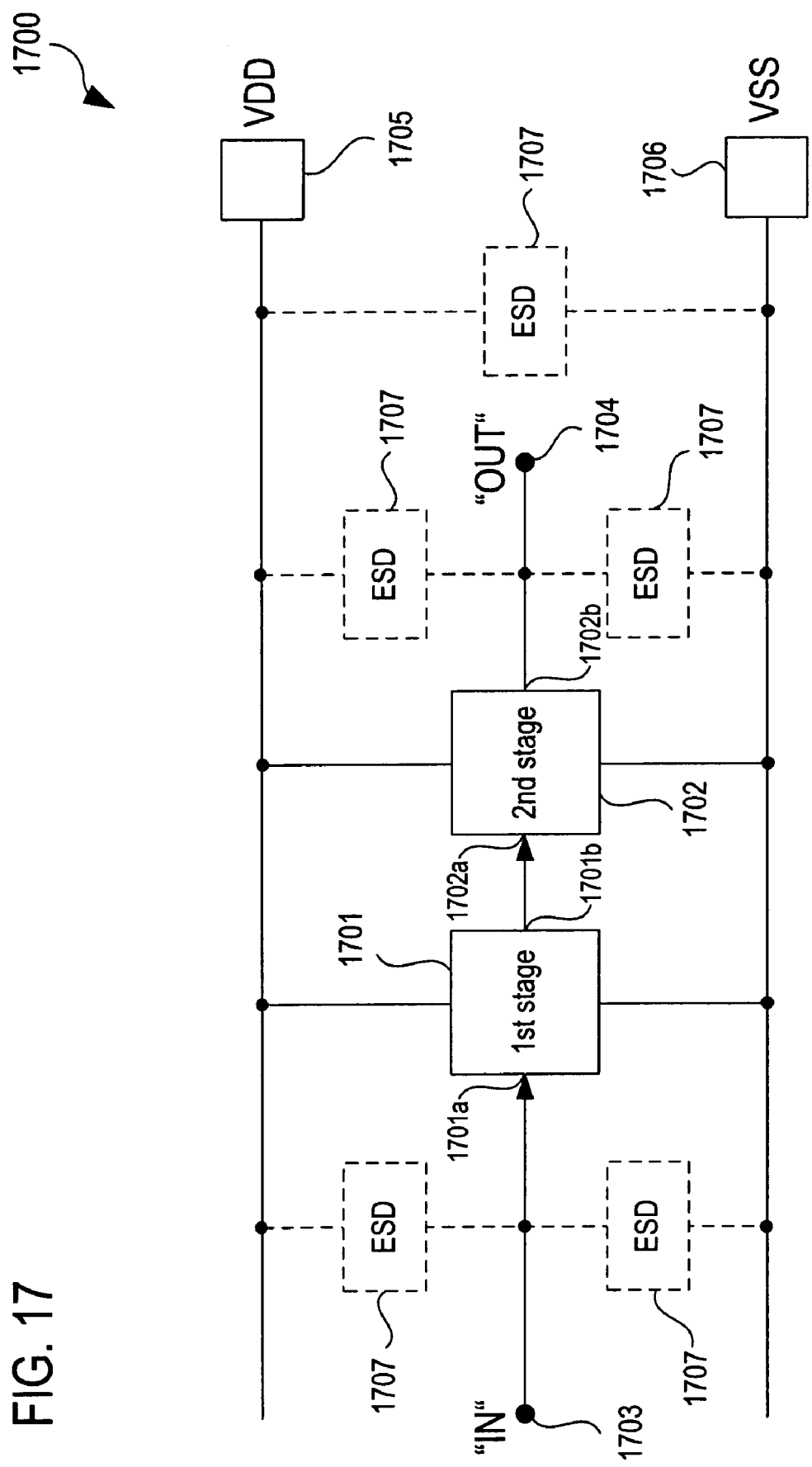
FIG. 17 shows a BiCMOS circuit arrangement in accordance with another embodiment.

FIG. 17 shows a BiCMOS circuit arrangement 1700 in accordance with another embodiment. FIG. 17 clearly is a detailed illustration of a combined integration of MuGFET and fin-based bipolar (e.g. BJT) circuits. The circuit arrangement 1700 includes a first circuit stage 1701 and a second circuit stage 1702, wherein an input 1702a of the second circuit stage 1702 is coupled to an output 1701b of the first circuit stage 1702. An input 1701a of the first circuit stage 1701 is coupled to an input terminal 1703 ("IN") of the circuit arrangement 1700, and an output 1702b of the second circuit stage 1702 is coupled to an output terminal 1704 ("OUT") of the circuit arrangement 1700. In accordance with an embodiment, the input terminal 1703 and the output terminal 1704 may in each case be configured for either an external connection ("off-chip") or a chip-internal connection. The first and second circuit stages 1701, 1702 may in each case be coupled between first ("VDD") and second ("VSS") electrical supply potentials, provided at first and second electrical supply terminals 1705 and 1706, respectively, as shown in FIG. 17. In accordance with other embodiments, the circuit arrangement 1700 may include more than two circuit stages (not shown), which may be coupled to one another and to the electrical supply potentials VDD and VSS, and between the input and output terminals 1703, 1704 of the circuit arrangement 1700. Clearly, in accordance with alternative embodiments, the series-connected first and second circuit stages 1701, 1702 may be replaced by n series-connected circuit stages, where n is an integer number.

In accordance with an embodiment, ESD protection devices 1707 may in each case be coupled between the input terminal 1703 and the first and second electrical supply terminals 1705, 1706 to provide optional ESD protection at the input terminal 1703 of the circuit arrangement 1700, as shown in FIG. 17. Furthermore, in accordance with another embodiment, electrostatic discharge (ESD) protection devices 1707 may in each case be coupled between the output terminal 1704 and the first and second electrical supply terminals 1705, 1706 to provide optional ESD protection at the output terminal 1704 of the circuit arrangement 1700, as shown in FIG. 17. Furthermore, in accordance with another embodiment, an ESD protection device 1707 may be coupled between the first and second electrical supply terminals 1705, 1706 to provide optional ESD protection at the supply terminals 1705, 1706, as shown in FIG. 17. Furthermore, in accordance with another embodiment (not shown in FIG. 17), the first and second circuit stages 1701, 1702 may be supplied with different supply voltages such that e.g. the fin-based bipolar circuit and the FinFET/MUGFET devices are operated at different voltages.

Each of the first and second circuit stages 1701, 1702 of the circuit arrangement 1700 may include one or more FinFET/MuGFET ("MOS") devices or one or more fin-based bipolar devices. Furthermore, each of the optional ESD protection devices 1707 may be configured as either a MOS device or as a fin-based bipolar device. The bipolar and MOS devices may be configured in accordance with one of the embodiments described herein. For example, at least one of the bipolar devices may be configured as a SEG bipolar device, e.g. as a vertical SEG BJT device or as a lateral SEG BJT device in accordance with one of the embodiments described herein. In accordance with another embodiment, at least one of the bipolar devices may be configured as a thyristor (e.g. as an SCR), e.g. in a similar manner as described herein in connection with FIG. 15.

FIG. 18 shows in a table 1800 possible combinations of FinFET/MuGFET devices (denoted as "MOS" in the table) and bipolar devices (denoted as "BJT" in the table) that may be used in the circuit arrangement 1700 of FIG. 17.

In the following, certain features and potential effects of illustrative embodiments are described.

In accordance with some embodiments, bipolar devices (e.g. bipolar transistors) that may have a vertical arrangement are provided in an SOI/FinFET technology, which may result in a high current gain/high cut-off frequency while providing a large junction area at a small device footprint.

In accordance with some embodiments, a BiCMOS process is provided, in which the bipolar devices may be integrated together with CMOS devices.

In accordance with some embodiments, bipolar transistors are provided that may be formed by the use of selective epitaxial growth (SEG). In accordance with some embodiments, the SEG forms two vertical pn-junctions. In accordance with other embodiments, lateral bipolar junction transistors (BJT) are provided. In accordance with some embodiments, the BJTs may be provided or fabricated in both FinFET and planar SOI technologies.

In accordance with some embodiments, bipolar junction transistor (BJT) devices and processes for MuGFET and/or SOI technologies are provided, including the following effects:

In accordance with one embodiment, a BJT may be formed using process steps of Selective Epitaxial Growth (SEG) which may allow for the deposition (i.e. growth) of doped silicon in vertical (and lateral) direction over a layer of seed silicon and hence the formation of vertical (and lateral) pn-junctions. In accordance with one embodiment, the formation of SEG may be locally blocked by a hard mask (e.g. a nitride hard mask).

A SEG-BJT in accordance with some embodiments may, for example, be used in applications including radio-frequency (RF), high-power or ESD protection transistors.

In accordance with one embodiment, an SEG step is used for the base region of a BJT, wherein the use of the SEG step may allow for the creation of a very thin base layer (having, for example, a thickness in the range from about 5 nm to 20 nm in accordance with some embodiments, e.g. about 10 nm in one embodiment), which may be advantageous for bipolar device operation (e.g. resulting in a high current gain and/or high switching frequency). In accordance with an embodiment, the base width and/or current gain may be determined by the process parameters for the deposition of the SEG (and not by layout parameters). For example, the base width may be determined by the thickness of the SEG grown layer. In accordance with another embodiment, it may be possible to add other materials in the deposition of the SEG (e.g. germanium) to form a hetero-junction transistor (HBT) and/or a doping gradient, which may, for example, be beneficial for high-frequency (HF) applications.

A SEG-BJT in accordance with some embodiments may be compatible with other devices of a MuGFET and/or SOI process technology.

A SEG-BJT in accordance with some embodiments may allow for an easy area-scaling of the device by means of the vertical junction (in contrast to perimeter-based scaling for a lateral device).

BJT devices in accordance with some embodiments may allow for a full integration of the BJT devices to form a full fin-type/SOI BiCMOS process.

In accordance with one embodiment, an electronic bipolar junction transistor device and a process for making the same in an integrated manner using FinFET and/or SOI technologies is provided. The device may include the following features:

In accordance with an embodiment, a fin-like structured seed silicon and two consecutive selective epitaxial growth (SEG) steps may be used to create a unique BJT geometry having both vertical and lateral current flow. Because of the fin-like geometry, the BJT may be highly area-efficient.

In accordance with another embodiment, a planar but structured seed silicon and SEG steps may be used to create a vertical BJT geometry.

In accordance with another embodiment, an undoped or lightly doped layer of silicon ("seed silicon") may be structured to define the lateral dimensions of the device. The lightly doped seed silicon layer may, for example, be obtained by a pre-doping process step or by using a SOI wafer with a desired doped silicon film layer.

In accordance with another embodiment, at least one of the functional regions of the BJT (emitter, base, or collector) may be formed by depositing an SEG material over the seed silicon. The SEG material may be highly doped (i.e. in-situ doped), or may be doped later (after deposition) using an ion implantation (e.g. S/D implant).

In accordance with some embodiments, the SEG material and the silicon ("seed silicon") may form a predominantly vertical pn-junction and may feature a predominantly vertical orientation of the current flow.

In accordance with another embodiment, at least one of the functional regions (emitter, base, or collector) of the transistor may be formed alternatively by conventional ion implantation into a portion of the seed silicon.

In accordance with another embodiment, at least parts of the silicon surfaces of the doped and/or SEG-grown regions may be silicided for an improved (i.e. lower) contact resistance.

In accordance with another embodiment, silicide blocking may be used to laterally separate the doped electrode regions and to prevent a surface short circuit of the electrodes.

In accordance with another embodiment, the material (e.g. silicon nitride) used for silicide blocking and/or a gate electrode material may be used to separate the doped regions (anode and cathode electrodes) from each other.

In accordance with one embodiment, the devices described herein may be fabricated on silicon-in-insulator substrates or wafers. In accordance with another embodiment, the devices described herein may be fabricated using a normal bulk wafer substrate as the SEG processes are fully compatible.

In accordance with another embodiment, a fin bipolar transistor is provided. The transistor includes a fin structure having sidewalls and a top surface, wherein at least a portion of the fin structure is doped with doping atoms of a first conductivity type. The transistor further includes a terminal layer that may be formed over at least a portion of the sidewalls and the top surface of the fin structure, and doped with doping atoms of a second conductivity type different from the first conductivity type. The transistor further includes an additional terminal layer that is formed over at least a portion of the terminal layer, and doped with doping atoms of the first conductivity type. In accordance with an embodiment, the terminal layer and/or the additional terminal layer of the transistor may be configured as an epitaxially grown layer. In other words, at least one of the terminal layer and the additional terminal layer may be formed by means of an epitaxial growth process. In accordance with another embodiment, the terminal layer may be configured as a base terminal layer, and the additional terminal layer may be configured as an emitter terminal layer of the transistor. In accordance with another embodiment, the fin bipolar transistor may further include a collector terminal layer that may be formed over at least a second portion of the sidewalls and the top surface of the fin structure, and doped with doping atoms of the first conductivity type. In accordance with another embodiment, the collector terminal layer may be configured as an epitaxially grown layer. In other words, the collector terminal layer may be formed by means of an epitaxial growth process. In accordance with another embodiment, the fin bipolar transistor may be configured such that in a region of the fin structure that is arranged at least partially between the base terminal layer and the collector terminal layer, the cross-sectional area of the fin structure increases in the direction from the base terminal layer towards the collector terminal layer.

While the invention has been particularly shown and described with reference to specific embodiments, it should be understood by those skilled in the art that various changes in form and detail may be made therein without departing from the spirit and scope of the invention as defined by the appended claims. The scope of the invention is thus indicated by the appended claims and all changes which come within the meaning and range of equivalency of the claims are therefore intended to be embraced.

What is claimed is:

1. A bipolar transistor, comprising:
a body region comprising a fin structure;
at least one terminal region formed on at least a portion of the body region,
wherein the at least one terminal region is formed as an epitaxially grown region, the at least one terminal region comprising:
a first terminal region formed at least on a first portion of the body region and configured as a first emitter/collector terminal region;
a second terminal region formed at least on a second portion of the body region and configured as a second emitter/collector terminal region; and
a third terminal region formed at least on a third portion of the body region and configured as a base terminal region, wherein the first emitter/collector terminal region, the second emitter/collector terminal region, and the base terminal region are laterally separated from each other forming a lateral bipolar transistor.

2. The bipolar transistor of claim 1,
wherein the first and second emitter/collector terminal regions are doped with doping atoms of a first conductivity type, and
wherein the base terminal region is doped with doping atoms of a second conductivity type different from the first conductivity type.

3. The bipolar transistor of claim 1, wherein the base terminal region is arranged between the first and second emitter/collector terminal regions.

4. The bipolar transistor of claim 1, wherein the second emitter/collector terminal region is arranged between the first emitter/collector terminal region and the base terminal region.

5. The bipolar transistor of claim 1, further comprising a substrate, wherein the body region is formed over the substrate.

6. The bipolar transistor of claim 5, wherein the substrate is configured as a silicon-on-insulator substrate or as a silicon bulk substrate, and wherein the body region is formed on an electrically insulating layer of the silicon-on-insulator substrate or from a silicon layer near the surface of the silicon bulk substrate.

7. A bipolar transistor, comprising:
a body region comprising a fin structure;
at least one terminal region formed over at least a portion of the body region,
wherein the at least one terminal region is formed as an epitaxially grown region,
the at least one terminal region comprising:
a first terminal region formed at least over a first portion of the body region and configured as a first emitter/collector terminal region;
a second terminal region formed at least over a second portion of the body region and configured as a second emitter/collector terminal region; and
a third terminal region formed at least over a third portion of the body region and configured as a base terminal region,
wherein the second emitter/collector terminal region is arranged between the first emitter/collector terminal region and the base terminal region.

8. The bipolar transistor of claim 7,
wherein the first and second emitter/collector terminal regions are doped with doping atoms of a first conductivity type, and
wherein the base terminal region is doped with doping atoms of a second conductivity type different from the first conductivity type.

9. The bipolar transistor of claim 7, further comprising a substrate, wherein the body region is formed over the substrate.

10. The bipolar transistor of claim 9, wherein the substrate is configured as a silicon-on-insulator substrate or as a silicon bulk substrate, and wherein the body region is formed on an electrically insulating layer of the silicon-on-insulator substrate or from a silicon layer near the surface of the silicon bulk substrate.

11. A bipolar transistor comprising:
a body region comprising a fin structure;
a first terminal region disposed over and contacting a first portion of the fin structure and configured as a first emitter/collector terminal region;
a second terminal region disposed over and contacting a second portion of the fin structure and configured as a second emitter/collector terminal region; and
a third terminal region disposed over and contacting a third portion of the fin structure and configured as a base terminal region, wherein the first emitter/collector terminal region, the second emitter/collector terminal region, and the base terminal region are laterally separated from each other forming a lateral bipolar transistor.

12. The bipolar transistor of claim 11,
wherein the first and second emitter/collector terminal regions are doped with doping atoms of a first conductivity type, and
wherein the base terminal region is doped with doping atoms of a second conductivity type different from the first conductivity type.

13. The bipolar transistor of claim 11, further comprising a substrate, wherein the body region is formed over the substrate.

14. The bipolar transistor of claim 13, wherein the substrate is configured as a silicon-on-insulator substrate or as a silicon bulk substrate, and wherein the body region is formed on an electrically insulating layer of the silicon-on-insulator substrate or from a silicon layer near the surface of the silicon bulk substrate.

15. The bipolar transistor of claim 11, wherein the first terminal region comprises a first epitaxial material region, wherein the second terminal region comprises a second epitaxial material region, and wherein the third terminal region comprises a third epitaxial material region.

16. The bipolar transistor of claim 11, wherein a portion of the first terminal region is disposed on a first portion of a top surface of the fin structure and a first portion of sidewalls of the fin structure.

17. The bipolar transistor of claim 16, wherein a portion of the second terminal region is disposed on a second portion of the top surface of the fin structure and a second portion of the sidewalls of the fin structure.

18. A bipolar transistor, comprising:
a body region comprising a fin structure;
a first terminal region disposed over and contacting a first portion of the fin structure and configured as a first emitter/collector terminal region;
a second terminal region disposed over and contacting a second portion of the fin structure and configured as a second emitter/collector terminal region; and
a third terminal region disposed over and contacting a third portion of the fin structure and configured as a base terminal region, wherein the second emitter/collector terminal region is arranged between the first emitter/collector terminal region and the base terminal region.

19. A bipolar transistor comprising:
a body region comprising a fin structure;
a first emitter/collector terminal region of the bipolar transistor disposed vertically over a first portion of the fin structure;
a second emitter/collector terminal region of the bipolar transistor disposed vertically over a second portion of the fin structure; and
a base terminal region of the bipolar transistor disposed vertically over a third portion of the fin structure, wherein the first emitter/collector terminal region, the second emitter/collector terminal region, and the base terminal region are laterally separated from each other forming a lateral bipolar transistor.

20. The bipolar transistor of claim 19,
wherein the first and second emitter/collector terminal regions are doped with doping atoms of a first conductivity type, and
wherein the base terminal region is doped with doping atoms of a second conductivity type different from the first conductivity type.

21. The bipolar transistor of claim 19, further comprising a substrate, wherein the body region is formed over the substrate.

22. The bipolar transistor of claim 21, wherein the substrate is configured as a silicon-on-insulator substrate or as a silicon bulk substrate, and wherein the body region is formed on an electrically insulating layer of the silicon-on-insulator substrate or from a silicon layer near the surface of the silicon bulk substrate.

23. The bipolar transistor of claim 19, wherein the second emitter/collector terminal region is arranged between the first emitter/collector terminal region and the base terminal region.

24. The bipolar transistor of claim 19, wherein the first emitter/collector terminal region comprises a first epitaxial material region, wherein the second emitter/collector terminal region comprises a second epitaxial material region, and wherein the base terminal region comprises a third epitaxial material region.

25. The bipolar transistor of claim 19, wherein a portion of the first emitter/collector terminal region is disposed on a first portion of a top surface of the fin structure and a first portion of sidewalls of the fin structure.

26. The bipolar transistor of claim 25, wherein a portion of the second emitter/collector terminal region is disposed on a second portion of the top surface of the fin structure and a second portion of the sidewalls of the fin structure.

\* \* \* \* \*